United States Patent
Chang-Hasnain et al.

(10) Patent No.: US 6,900,920 B2
(45) Date of Patent: May 31, 2005

(54) VARIABLE SEMICONDUCTOR ALL-OPTICAL BUFFER USING SLOW LIGHT BASED ON ELECTROMAGNETICALLY INDUCED TRANSPARENCY

(75) Inventors: Connie J. Chang-Hasnain, Palo Alto, CA (US); Pei-Cheng Ku, Richmond, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 10/251,917

(22) Filed: Sep. 20, 2002

(65) Prior Publication Data

US 2003/0076865 A1 Apr. 24, 2003

Related U.S. Application Data

(60) Provisional application No. 60/324,201, filed on Sep. 21, 2001.

(51) Int. Cl.[7] .............................. G02F 1/03; G02F 1/07
(52) U.S. Cl. ...................... 359/244; 359/247; 359/248; 359/255
(58) Field of Search .......................... 359/244–48, 277, 359/255, 257, 298, 280, 296; 348/1–3, 131; 385/1–3, 131

(56) References Cited

U.S. PATENT DOCUMENTS

| | | | | | |
|---|---|---|---|---|---|
| 4,915,482 | A | * | 4/1990 | Collins et al. | 359/276 |
| 5,157,537 | A | * | 10/1992 | Rosenblatt | 359/245 |
| 6,177,684 | B1 | * | 1/2001 | Sugiyama | 257/17 |
| 6,426,831 | B1 | * | 7/2002 | Schmidt et al. | 359/326 |
| 6,507,042 | B1 | * | 1/2003 | Mukai et al. | 257/14 |
| 2002/0094597 | A1 | * | 7/2002 | Lin et al. | 438/57 |

* cited by examiner

Primary Examiner—Jordan M. Schwartz
Assistant Examiner—Jessica Stultz
(74) Attorney, Agent, or Firm—John P. O'Banion

(57) ABSTRACT

A variable semiconductor all-optical buffer and method of fabrication is provided where buffering is achieved by slowing down the optical signal using a control light source to vary the dispersion characteristic of the medium based on electromagnetically induced transparency (EIT). Photonic bandgap engineering in conjunction with strained quantum wells (QWs) and quantum dots (QDs) achieves room temperature operation of EIT. Photonic crystals are used to sharpen the spectral linewidths in a quantum well structure due to its density of states and in a quantum-dot structure caused by the inhomogeneity of the dot size, typically observed in state-of-the-art QD materials. The configuration facilitates monolithic integration of an optical buffer with an amplifier and control laser to provide advantages over other material systems as candidates for optical buffers.

77 Claims, 15 Drawing Sheets

VARIABLE SEMICONDUCTOR ALL-OPTICAL BUFFER USING SLOW LIGHT BASED ON ELECTROMAGNETICALLY INDUCED TRANSPARENCY

CROSS-REFERENCE TO RELATED APPLICATIONS

This application claims priority from U.S. provisional application Ser. No. 60/324,201 filed on Sep. 21, 2001, incorporated herein by reference.

STATEMENT REGARDING FEDERALLY SPONSORED RESEARCH OR DEVELOPMENT

Not Applicable

REFERENCE TO A COMPUTER PROGRAM APPENDIX

Not Applicable

BACKGROUND OF THE INVENTION

A. Field of the Invention

The present invention pertains generally to optical communications, and more particularly to a variable semiconductor all-optical buffer where electromagnetically induced transparency is used to slow light.

B. Publications Incorporated by Reference

The following publications are hereby incorporated by reference:

1. C. J. Chang-Hasnain, et. al. "Integrated external cavity quantum well laser array using single epitaxial growth on a patterned substrate", Appl. Phys. Lett., vol. 56, No. 5, p. 429, January 1990.

2. C. S. Chang, S. L. Chuang, J. Minch, Y. K. Chen, and T. Tanbun-Ek, "Amplified spontaneous emission spectroscopy in strained quantum-well lasers," IEEE J. Selected Topics Quantum Electron., Special issue on Applied Optical Diagnostics of Semicond. 1, p. 1100 (1995).

3. T. Keating, J. Minch, C. S. Chang, P. Enders, W. Fang, S. L. Chuang, T. Tanbun-Ek, T. K. Chen, M. Sergent, "Optical gain and refractive index of a laser amplifier in the presence of pump light for cross-gain and cross-phase modulation," IEEE PTL, 9, p. 1358 (1997).

4. J. Minch, S. H. Park, J. Minch, and S. L. Chuang, "Theory and experiment of InGaAsP and InGaAlAs long-wavelength strained quantum-well lasers," IEEE JQE., 35, p. 771 (1999).

5. S. E. Harris, "Electromagnetically induced transparency," Phys. Today, p. 36, July 1997.

6. J. P. Marangos, "Topical review: Electromagnetically induced transparency," J. Modern Optics, vol. 45, no. 3, pp. 471–503 (1998).

7. C. Liu, Z. Dutton, C. H. Behroozi, and L. V. Hau, "Observation of coherent optical information storage in an atomic medium using halted light pulses," Nature, vol. 409, p. 490, January 2001.

8. D. F. Phillips, A. Fleischhauer, A. Mair, R. L. Walsworth, and M. D. Lukin, "Storage of light in atomic vapor," Phys. Rev. Lett., vol. 86, pp. 783–786, January 2001.

9. K. L. Vodopyanov, G. B. Serapiglia, C. Sirtori, and J. Faist, "Electromagnetically induced transparency in a three-subband semiconductor quantum well," QELS, pp. 258, May 1999.

10. C. C. Phillips, E. Paspalakis, G. B. Serapiglia, C. Sirtori, and K. L. Vodopyanov, "Observation of electromagnetically induced transparency and measurements of subband dynamics in a semiconductor quantum well," Physica E 7, pp. 166–173 (2000).

11. K. D. Choquette, K. M. Geib, C. I. H. Ashby, R. D. Twesten, O. Blum, H. Q. Hou, D. F. Follstaedt, B. E. Hammons, D. Mathes, and R. Hull, "Advances in selective wet oxidation of AlGaAs Alloys", IEEE J. of Selected Topics Quantum Electron., vol. 3, pp. 916–926 (1997).

12. R. Langenhorst, M. Eiselt, W. Pieper, G. Grosskopf, R. Ludwig, L. Kuller, E. Dietrich, and H. G. Weber, "Fiber loop optical buffer," J. Lightwave Technol., 14, 3, pp. 324–335, March 1996.

13. J. D. Moores, K. L. Hall, S. M. LePage, K. A. Rauschenbach, W. S. Wong, H. A. Haus, and E. P. Ippen, "20-GHz optical storage loop/laser using amplitude modulation, filtering, and artificial fast saturable absorption," IEEE Photon. Technol. Lett., vol. 7, pp. 1096–1098, September 1995.

14. K. L. Hall, J. D. Moores, K. A. Rauschenbach, W. S. Wong, E. P. Ippen, and H. A. Haus, "All-optical storage of a 1.25 kb packet at 10 Gb/s," IEEE Photon. Technol. Lett., 7, p. 1093 (1995).

15. K. L. Hall, "40-Gbit/s optical packet buffering," Proc. Conf. OFC, ThD3, pp. 251–252 (1997).

16. J. P. Marangos, "Electromagnetically induced transparency," J. Modern Optics 45, 471 (1998).

17. D. F. Phillips, A. Fleischhauer, A. Mair, R. L. Walsworth, and M. D. Lukin, "Storage of Light in Atomic Vapor," Phys. Rev. Lett. 86, 783 (2001).

18. A. V. Turukhin, V. S. Sudarshanam, M. S. Shahriar, J. A. Musser, B. S. Ham, and P. R. Hemmer, "Observation of Ultraslow and Stored Light Pulses in a Solid," Phys. Rev. Lett. 88, 023602 (2002).

19. J. B. Khurgin, "Light slowing down in Moire fiber gratings and its implications for nonlinear optics," Phys. Rev. A 62, 013821 (2000).

20. T. Kataoka, T. Tokizaki, and A. Nakamura, "Mesoscopic enhancement of optical nonlinearity in CuCl quantum dots: Giant-oscillator-strength effect on confined excitons," Phys. Rev. B 48, 2815 (1993).

21. P. Borri, W. Langbein, S. Schneider, U. Woggon, R. L. Sellin, D. Ouyang, and D. Bimberg, "Ultralong Dephasing Time in InGaAs Quantum Dots," Phys. Rev. Lett. 87, 157401 (2001).

22. K. Brunner et al., in *Proceedings 24th International Conference on the Physics of Semiconductors*, Jerusalem, Israel, 1998.

23. J. Mori et al., "1.3–1.5 µm wavelength quantum dots self-formed in GaAs/InAs superlattices grown on InP(411) substrates," 2001 International Conference on Indium Phosphide and Related Materials, WP-63.

24. J. R. Guest, "Measurement of optical absorption by a single quantum dot exciton," *Phys. Rev. B*, vol. 65, 241310R, 2002.

25. A. F. Tsatsul'nikov et al., in *Proceedings 24th International Conference on the Physics of Semiconductors*, Jerusalem, Israel, 1998.

26. D. Bimberg et al., *Quantum Dot Heterostructures*, John Wiley & Sons, 1999.

27. S. Kim et al., "Growth and characterization of InGaAs—InGaP quantum dots for midinfrared photoconductive detector," *Appl. Phys. Lett.*, vol. 73, pp. 963–965, August 1998.

28. M. Sopanen et al., "Self-assembled GaInNAs quantum dots for 1.3 and 1.55 µm emission on GaAs," *Appl. Phys. Lett.*, vol. 76, pp. 994–996, February 2000.

29. B. Damilano et al., "From visible to white light emission by GaN quantum dots on Si(111) substrate," *Appl. Phys. Lett.*, vol. 75, pp. 962–964, August 1999.

30. H. S. Hirayama, in *Proceedings of 2nd International Conference on Nitride Semiconductors*, Tokushima, Japan, p. 472. 1997.

31. J. Porsche et al., "Growth of self-assembled InP quantum islands for red-light-emitting injection lasers," IEEE JSTQE, vol. 6, pp. 482–490, 2000.

32. P. M. Thibado et al., "Evolution of GaSb epitaxy on GaAs(001)-c(4×4)," *J. Vac. Sci. Technol. A*, vol. 14, pp. 885–889, May 1996.

33. H. C. Ko et al., "Self-organized CdSe quantum dots onto cleaved GaAs (110) originating from Stranski-Krastanow growth mode," *Appl. Phys. Lett.*, vol. 70, pp. 3278–3280, June 1997.

34. M. Lowisch et al., "Zero-dimensional excitons in (Zn,Cd)Se quantum structures," *Phys. Rev. B*, vol. 54, R11074, 1996.

35. T. Kataoka et al., "Mesoscopic enhancement of optical nonlinearity in CuCl quantum dots Giant-oscillator-strength effect on confined excitons," *Phys. Rev. B*, vol. 48, pp. 2815–2818, July 1993.

C. Discussion of the Background Art

An optical fiber delay line, also known as a digital "optical buffer", is one of the most important components for all-optical communications and optical-signal processing systems. Such a buffer must be able to store the data packets for a substantial period of time and must be able to release the data within an acceptable delay when the switch is clear for routing.

The major components of a single fiber optical buffer consists of a fiber loop, an optical isolator, 3-dB couplers, and several semiconductor laser amplifiers for the gating, interconnection, and loss compensation. All-optical storage of a 1.76 kb packet of 20 Gb/s pulsed and noise-generated data has been demonstrated using amplitude modulation, filtering, and artificial fast saturable absorption. In these experiments, a pump laser for pumping an erbium-doped fiber connected to a 12 m single-mode fiber is used with a LiNbO$_3$ modulator. Loading and unloading of 40 Gb/s data packets have also been demonstrated using a fiber loop optical buffer using a similar setup.

The fundamental difficulty facing the design of an optical buffer is that variable-length buffers must be implemented with delay lines. However, by their nature, fiber loop optical delay lines are of fixed length. Once a packet has entered the delay line, it can only emerge at a fixed duration later. It is impossible to remove the packet from the delay line before that time interval. Therefore, since the delay is for a fixed amount of time, this type of buffer has very limited applications.

However, fiber delay lines are not the only manner in which light can be slowed. There have been major breakthroughs in achieving "slow light" using the principles developed under electromagnetically induced transparency (EIT). Experimentally, research groups have independently "slowed down" light propagation in two different materials, a gas of cold sodium atoms and a glass cell containing rubidium, which was heated up to create rubidium vapor. Slow-down factors as high as seven orders of magnitude (down to 17 m/s) have been reported in both atomic vapor cells and Pr doped Y$_2$SiO$_5$ crystals. The slow light principle is based on creating destructive interference between two optical transitions in electronic states by means of an optical pump field, modifying the dispersion spectrum experienced by the optical signal. Other mechanisms such as a Moire grating have also been proposed to modify the dispersive characteristics.

A large group velocity reduction can be achieved in a medium without loss and the minimum dispersion by looking at the relationship of $v_g(\omega)$ and $\chi(\omega)$, the susceptibility of the medium. The real and imaginary part of the susceptibility $\chi'(\omega)$ and $\chi''(\omega)$ are related by the Kramers-Kronig relations. The refractive index and the group velocity can then be expressed in terms of the real and imaginary part of the complex susceptibility. The group velocity can be expressed as $$v_g = \frac{c}{\left(n + \omega \frac{\partial n}{\partial \omega}\right)_{\omega=\omega_0}}$$

The dispersion parameter D (ps/nm-km) can be expressed as $$D = -\frac{2\pi}{\lambda^2}\left(2\frac{dn}{d\omega} + \omega\frac{d^2n}{d\omega^2}\right)_{\omega=\omega_0}$$

For a large velocity reduction, a large and positive $dn(\omega)/d\omega$ is necessary; whereas for a small D, a small and negative $d^2n(\omega)/d\omega^2$ is desirable. For a small loss, $\chi''(\omega)$ must be minimized.

A typical 2-level transition does not satisfy these criteria. However, these criteria can be met for a three level system, $|1\rangle$, $|2\rangle$ and $|3\rangle$. FIG. 1A shows a three-level (1, 2, 3) system with the coupling laser in resonance with states 2 and 3, resulting in a set of dressed states on the right. There are three basic energy level schemes for a three-level system interacting with two near-resonance electromagnetic fields, a ladder or cascade system ($E_1 < E_2 < E_3$), a Λ scheme ($E_1 < E_3 < E_2$), and a V-scheme ($E_2 < E_1$ and $E_3$), where, as can be seen in FIG. 1A, $|1\rangle$ to $|2\rangle$, and $|2\rangle$ to $|3\rangle$ transitions are dipole allowed, while $|1\rangle$ to $|3\rangle$ is generally dipole forbidden (metastable). By optically pumping the system with an energy corresponding to $E_3 - E_2$, we induce a coherence interaction between $|2\rangle$ and $|3\rangle$ and effectively split energy state $|2\rangle$ into two coherently coupled dressed states of $|2d\rangle$ and $|3d\rangle$. More discussions on the subject of the electromagnetically induced transparency (EIT) effect and quantum coherence can be found in the literature. As the two new states are coherent, the real and imaginary susceptibility spectra for the dressed states can be represented by FIG. 1B. It can be seen that, for a photon energy in between the two transitions, the first derivative of $n(\omega)$ can be very large and positive. By carefully designing the linewidth of the two transitions, the absorption and the second derivative and, effectively, D can all be minimized. As the coherence of the two new states is provided by the optical pump beam, a controlled velocity reduction factor (optical memory size) may be obtained by tailoring the intensity or detuning of this pump beam.

In semiconductor materials systems, EIT has been observed at T=30 K using three levels in the quantized conduction band of an n-type doped quantum-well structure. In particular, it was found that the absorption of the 1 to 2 state transition in a 1-2-3 ladder configuration is significantly reduced when the pump (control) field is tuned to half energy of the 1 to 3 level transition energy with a simultaneous splitting of the absorption peak on both sides of the peak absorption wavelength, as expected from the imaginary part of the susceptibility (dashed curve) in FIG. 1B. As a result of the control field, the originally absorbing medium becomes transparent at the center frequency, yet the group velocity will decrease significantly as expected from the real part of the susceptibility (solid curve) in FIG. 1B.

As expected from a semiconductor quantum well (QW) structure, the density of states is continuous and the resulting EIT effect is small and observed only at low temperatures. The development of quantum dots (QD) and quantum wires for optical emitters is a topic of intense research due to the theoretical promise of ultra-low threshold currents and temperature independent emission characteristics of such structures. However, technical realization of the full potential of such structures is still seriously hampered by the variability of the currently available material that is based on the self-organized growth of such low-dimensional structures. The best laser results currently are obtained from self-assembled InAs QDs on a GaAs substrate. The effect of strain (lattice mismatch) appears to be a major cause for the improved optical quality.

Therefore, there is a need for a technique to increase the coherent interaction of the states and obtain a large slow-down factor at room temperature. There is also a need for a medium that can slow down the group velocity of optical transmission with a controlled slow-down factor such that the medium is effectively an optical memory via true time delay. By controlling this group velocity reduction factor, the memory length can be adjusted to the desired values with minimum pulse dispersion or optical loss.

A further need exists for an optical buffer on compound semiconductor using photonic bandgap engineered quantum-dot (QD) devices. By using QD in photonic crystals, much sharper energy levels on semiconductors can be achieved, which is required for attaining EIT. This will result in group velocity reduction and thus switchable optical memory in such samples.

There have been a lot of research efforts on quantum dots (QD) and QD devices. To date, however, none has yielded optical devices with expected properties. This is primarily due to processing difficulty, which typically creates either highly nonuniform dots or dots with many surface defects. The nonuniformity introduces significant inhomogeneous broadening, which reduces the effectiveness of energy quantization. However, the defects lead to recombination centers, making the material inferior for optical applications.

There are many major advantages for all-optical buffers on compound semiconductor, rather than Si or optical fiber. Optical loss is a major trade-off with a large group velocity reduction and low dispersion. The use of compound semiconductors enables distributed integration of semiconductor optical amplifiers and buffers. Further integration with optical waveguiding structure, a control laser and optical coupler are all advantageous.

BRIEF SUMMARY OF THE INVENTION

All-optical packet switched network is highly promising for next generation broadband optical fiber communications. One most critical and yet missing component is an all-optical buffer. Accordingly, the foregoing needs are met by the present invention which comprises a semiconductor-based variable optical buffer. In accordance with the present invention, the buffering effect is achieved by slowing down the optical signal using a control light source to vary the dispersion characteristic of the medium. A slow-down factor of more than $10^4$ with negligible group velocity dispersion is achievable.

An optical buffer according to the present invention will be important for a number of applications in communications. First, it is a true time delay with a variable and bit-controllable delay. This can be useful for antenna remoting and beam forming applications. Secondly, it is an all-optical memory, a fundamental building block for photonic switching and all-optical packet-switched network applications. Finally, the delay time of the inventive device will be on a bit by bit base, i.e. with a control time constant faster than the bit rate of the data transmitted. Hence, this device can perform a unique time-domain transformation, i.e. transforming an analog signal in the control beam to the time delay of a digital signal in the signal beam. This function will find applications in all-optical signal processing and optical analog-to-digital conversion.

An aspect of the invention is to use electromagnetically induced transparency (EIT) as a cornerstone of an optical buffer. By way of example, and not of limitation, as a special case of EIT, the propagation speed of light in a medium can be slowed down considerably using a control laser. Another aspect of the invention is to use the controllable slow light to make an all-optical optical buffer, where the memory size is determined by the slow-down factor and the length of the medium.

Another aspect of the invention is to provide a semiconductor-based digital optical buffer. By way of further example, the present invention uses photonic bandgap engineering in conjunction with strained quantum wells (QWs) and quantum dots (QDs) to achieve room temperature operation of EIT. Photonic crystals are used to sharpen the spectral linewidths in a quantum well structure due to its density of states and in a quantum-dot structure caused by the inhomogeneity of the dot size, typically observed in state-of-the-art QD materials.

Another aspect of the invention is a 3D photonic bandgap-engineered material (3D Bragg cell) involving the fabrication of buried AlOx channels. By way of further example, growth on a patterned substrate is used to create $Al_xGa_{1-x}As$ layers with laterally varied Al composition x, and thereby creating periodic channels with high Al concentration. These channels can subsequently be made into AlOx using wet thermal oxidation based on the fact that the oxidation rate has an exponential dependence on x. Multiple layers of such channels can be created in one single growth or multiple growths to create a 3D photonic crystal made of buried AlOx. The advantages include facilitation of current injection structure and minimized defects typically found in etched structures. Further, due to the large index difference, a small number of pairs of AlOx channels will be sufficient to eliminate transitions at the desired wavelengths.

Another aspect of the invention comprises strained self-assembled quantum dots, such as highly strained InAs QDs grown on a GaAs substrate, or InAsP or InGaAsP QDs grown on an InP substrate.

An aspect of the invention also pertains to controlling slow-light using an electric field. The use of semiconductor quantum structures (e.g., quantum wells (QW), quantum wires (QWW) and quantum dots (QD)) facilitates the use of an electric field to control the coupling of the quantized states. The electric field can be used to reduce the required sharpness in energy transitions and optical intensity of the control laser in structures such as coupled compressive strained QWs, coupled tensile QWs, coupled strained QWs with compressive and tensile strain, and strained InAs compressive quantum dot structure. The goal is to engineer the interband and intersubband optical transition dipole moments for optimized effects in EIT and to use electric field to control the coupling strength. Though a pump laser is still necessary, the control signal may be carried by the electric field, allowing a faster and more precise control.

Still another aspect of the invention is to provide for monolithic integration of an optical buffer with an amplifier and control laser. Monolithic integration of optoelectronic devices presents a tremendous advantage over other material systems as candidates for optical buffers. Typical design trade-offs of slow-light media include control laser optical intensity and propagating optical loss. The former determines the tolerable linewidths of the transition states and the latter, the optical memory size. In general, the maximum optical intensity that can be coupled into a semiconductor waveguide structure is determined by the catastrophic optical damage (COD) limits of the facets. The optical intensity limit can be increased by several orders of magnitude if the control laser is monolithically integrated with the slow-light medium. Further, the memory size constraint imposed by propagation loss can be alleviated by integrating an optical amplifier (or distributed amplifiers).

It will be appreciated that the advantages of the inventive semiconductor-based variable optical buffer are numerous compared to gas cells (typically containing Rb or Na gases) and fiber optical delay lines. These advantages include compactness, low power consumption, and monolithic integration with electronic and other optoelectronic devices, such as amplifiers, lasers, optical couplers, modulators, and photodetectors. The semiconductor-based devices can be fabricated in an array. Furthermore, the control of optical memory may be in the form of another laser beam, such as in existing slow-light demonstrations, or most interestingly in the form of an electric field or voltage source.

Another aspect of the inventive device, which simulates the sharp transitions of an atomic vapor, is to increase the coherent interaction of the states and obtain a large slow-down factor at room temperature.

Another aspect of the invention is to provide a method of fabrication of an all-optical buffer on compound semiconductors. The basic idea centers on making a medium that can slow down the group velocity of optical transmission with a controlled slow-down factor such that the medium is effectively an optical memory via true time delay. By controlling this group velocity reduction factor, the memory length can be adjusted to the desired values with minimum pulse dispersion or optical loss.

A still further aspect of the invention is to fabricate optical buffers in compound semiconductor at room temperature using photonic bandgap engineered quantum-dot (QD) devices. Using QD in photonic crystals, much sharper energy levels on semiconductors can be achieved, which is required for attaining EIT.

Another aspect of the invention is to enable distributed integration of semiconductor optical amplifiers and buffers through the use of compound semiconductors.

A still further aspect of the invention is to integrate a control laser and optical coupler in an optical waveguiding structure.

Further advantages and aspects of the invention will be brought out in the following portions of the specification, wherein the detailed description is for the purpose of fully disclosing preferred embodiments of the invention without placing limitations thereon.

BRIEF DESCRIPTION OF THE DRAWINGS

The invention will be more fully understood by reference to the following drawings which are for illustrative purposes only and where like reference numbers denote like elements.

DETAILED DESCRIPTION OF THE INVENTION

1. Introduction

Figure 1B:
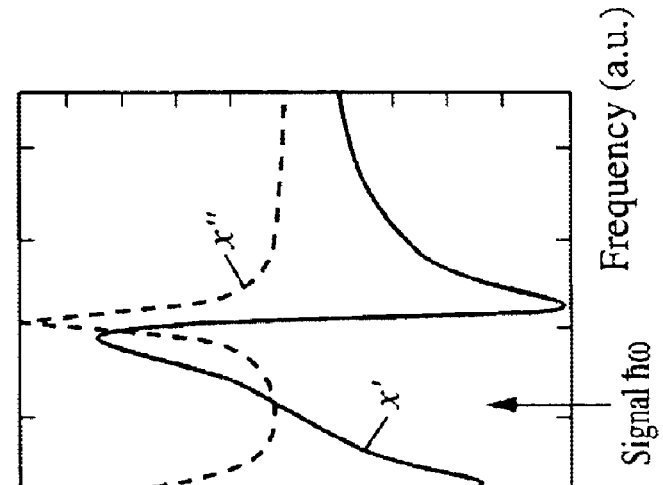
FIG. 1B is a graph of showing the real and imaginary part of susceptibility for the dressed states shown in FIG. 1A.
Figure 1A:
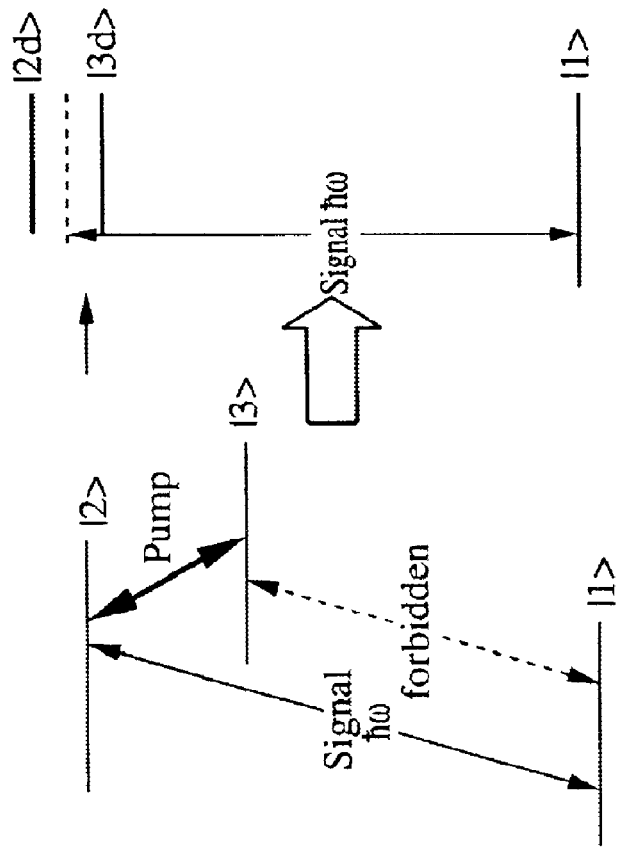
FIG. 1A is a diagram of a three-level (-1, 2, 3) system with the coupling laser in resonance with states 2 and 3, resulting in a set of dressed states.

It will be appreciated that a class of semiconductor-based devices that can slow or store light can have a variety of applications, particularly those in optical communications. Such a class of devices can be fabricated in accordance with the present invention using the three-level atomic system in which the two upper levels are closely spaced and the signal wavelength is the average of the difference between each of the upper level to the ground state. Large refractive index dispersion with low absorption experienced by the optical signal results in a reduction of signal velocity and, therefore, the time required for the signal to pass through the device. Optical amplifiers can then be used to compensate the propagation loss. The size of the device is determined by the amount of signal velocity reduction, which is a function of the energy spacing between two upper levels. External field, such as voltage and pressure, can be used to tune the spacing and therefore change the delay time. In terms of digital optical communication, this delay corresponds to the number of bits shifted by the shift register. Additionally, the register size is linearly scalable by series cascading.

The present invention is based on decreasing the propagation speed of the optical signal by reducing the group velocity of the signal. This is accomplished by engineering a large dispersion to decrease the group velocity. The advantages of this approach are two-fold: (i) it is transparent to bit-rate and wavelength of the optical signal, and (ii) the amount of delay is controllable by changing the dispersion.

The optical signal propagation speed is determined by the group velocity of the signal and is defined by $$v_g \equiv \left. \frac{c}{n + \omega \frac{dn}{d\omega}} \right|_0$$

where n is the refractive index as a function of frequency $\omega$, c is the speed of light in vacuum and the derivative is evaluated at the carrier frequency of the signal. For convenience, the above formula and related formulas are based on SI units.

If the derivative of the refractive index with respect to the frequency is positive and large, we see that the group velocity is reduced by a factor $n+\omega \, dn/d\omega|_0$. From Kramers-Kronig relation, the refractive index for any media is related to the absorption spectrum of the same media through Kramers-Kronig relation. There is a large magnitude of derivative of the refractive index with respect to the frequency that can be achieved with single absorption peak but the sign is negative. However, in the case where there are two closely spaced absorption peaks, a large positive derivative can be achieved. On the other hand, since the second derivative in the latter case is zero or close to zero, the optical signal will not experience distortion when propagating through the media. Large group velocity reduction has been previously reported in experiments by various researchers using electromagnetically induced transparently (EIT) but creating two absorption peaks using EIT required sophisticated experimental setups.

In the present invention, there are three criteria that are important for achieving successful reduction of group velocity: (i) three sharp, in the sense that the linewidth is small, energy levels in which the spacing between two upper levels is much smaller than the spacing between either of the upper levels and the ground state; (ii) optical transition between the ground state and either of the upper levels is allowed; and (iii) there are some carriers present in the ground state.

The absorption spectrum preferably should be positive in the sense that absorption rather than gain occurs. If there are two gain peaks instead of two absorption peaks, the sign of the first derivative of the refractive index with respect to the frequency negative is obtained. A single gain peak can yield a positive derivative but will exhibit a large second derivative; hence the signal will experience severe distortion. Examples of the configurations are strongly coupled quantum dots, pure or mixtured atomic gas such as rubidium or cesium, and doped optical fiber.

Figure 2:
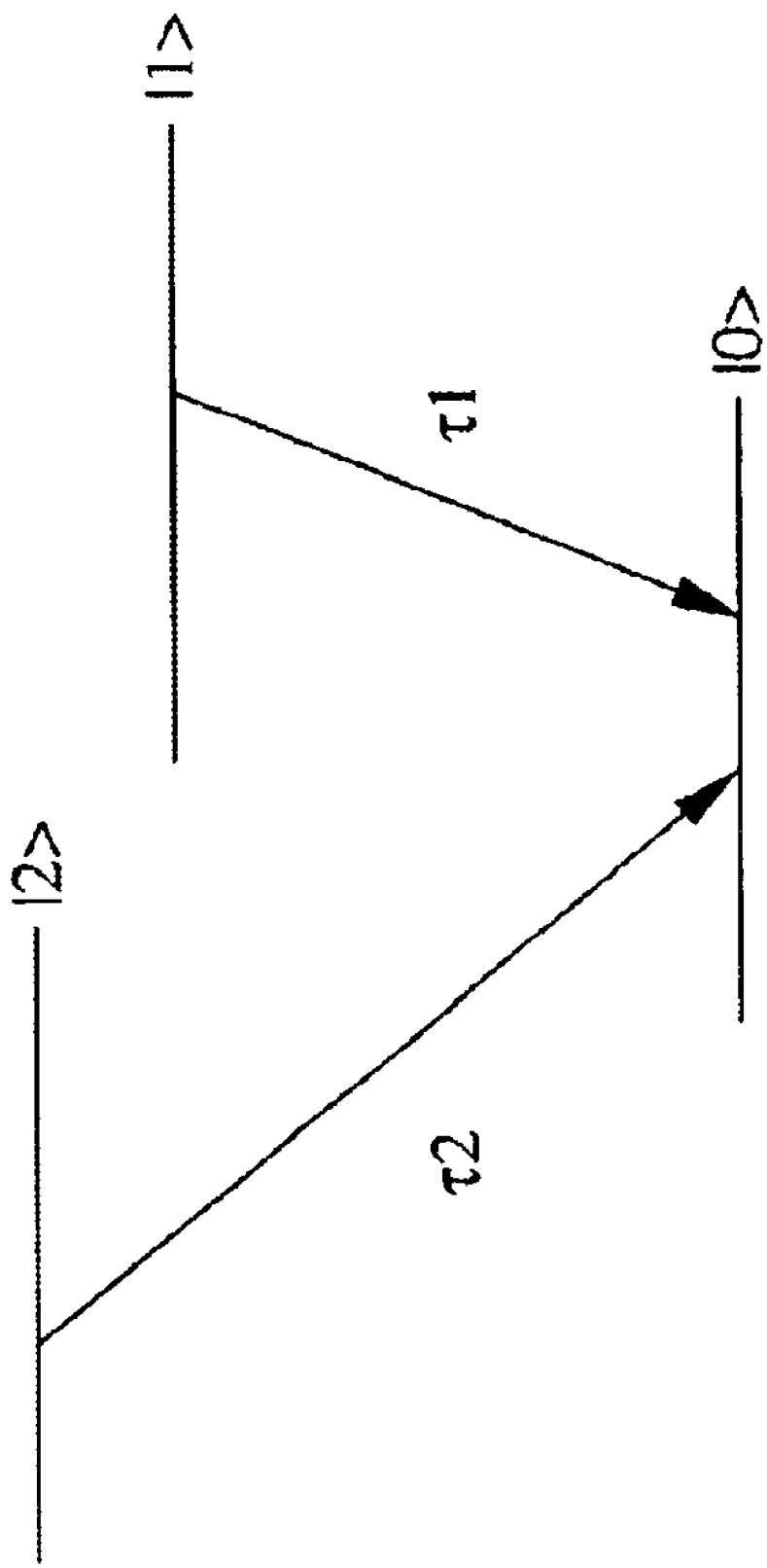
FIG. 2 is a diagram of a three-level system with two close spaced upper levels where the transition between the two upper levels is forbidden.

Consider a three-level system with two closely spaced upper levels as shown in FIG. 2 and assume the transition between the two upper levels is forbidden. The susceptibility X can be obtained semi-classically through density matrix formulism by treating atoms quantum mechanically and electromagnetic waves classically. Kramers-Kronig relation relates the real and imaginary part of the susceptibility, with the following results assuming that the exchange of carriers between two upper levels is included into the linewidths of each of the upper states:

$$\mathrm{Re}[\chi(\omega)] \equiv \chi'(\omega) = \sum_{n=1}^{2} \frac{\mu_n^2 T_{2n} \Delta N_{0n}}{\varepsilon_0 \hbar} \frac{(\omega_{0n} - \omega) T_{2n}}{1 + (\omega_{0n} - \omega)^2 T_{2n}^2 + 4\Omega_n^2 T_{2n} \tau_n}$$

$$\mathrm{Im}[\chi(\omega)] \equiv \chi''(\omega) = \sum_{n=1}^{2} \frac{\mu_n^2 T_{2n} \Delta N_{0n}}{\varepsilon_0 \hbar} \frac{1}{1 + (\omega_{0n} - \omega)^2 T_{2n}^2 + 4\Omega_n^2 T_{2n} \tau_n}$$

where n is the index of the upper energy levels, $T_2$ is the dephasing time constant between the upper level and ground state $|0>$, $\tau$ is the lifetime from the excited states (either in $|1>$ or $|2>$) to go back to the ground state, $\omega_0$ is the frequency spacing between the upper level and ground state, $\in_0$ is the dielectric constant in vacuum, $\mu$ is the electric dipole moment due to the external applied electromagnetic field, and $\Omega$ is the Rabi's frequency defined by $\Omega = \mu E_0/2\hbar$. If $\tau$ is smaller than $T_2$, then all the $T_2$s in the above formula for $\chi$ should be replaced by $\tau$.

Also consider a one-dimensional problem that an optical signal with carrier frequency $\omega_0$ propagates through this three-level atomic system. The group velocity of this signal pulse will be reduced by a factor that is determined by the dispersion relation between $\omega$ and k. This dispersion relationship in the problem is completely determined by the interaction between the optical signal and atoms provided that the system is homogeneous. In a waveguide structure, it is necessary to add the contribution from the waveguide structure, but this will not change the major result derived for the homogeneous media that will be assumed in the following discussion. The solution for Maxwell equations in a linear, homogeneous medium can be Fourier expanded by normal modes with definite frequency. Each normal mode can be further expanded with different k vectors as follows:

$$\vec{E}(z,t) = \int \int dk \, d\omega \, \vec{A}(k,\omega) \exp(ikz - i\omega t).$$

The two integrating variables k and $\omega$ are not independent because we demand the field strength to be the solution of the Maxwell equation. The relationship between k and $\omega$ describes the interaction between the laser beam and the atoms as follows:

$$k = \sqrt{\varepsilon_0(1+\chi(\omega))} \, \frac{\omega}{c} \equiv \sqrt{\varepsilon(\omega)} \, \frac{\omega}{c} \equiv \frac{n\omega}{c}.$$

This normal mode expansion has the advantage that quantization can be done simply by replacing the amplitude A (k, ω) by the corresponding annihilation operator a in Fock's space. Therefore hereafter we will use the terms photons and laser beam interchangeably. Note, however, that this quantization procedure actually only holds for vector potential A. There will be a sign change for the negative frequency part of the electric field the electric field is quantized, but the major results remain the same.

The value n defined above is a complex number and has the meaning of refractive index when it becomes a real number; that is, the dielectric constant or susceptibility becomes a real quantity. Note that the complex dielectric constant $\in$ is defined in many textbooks as:

$$\varepsilon = \left(n + \frac{i\alpha c}{2\omega}\right)^2.$$

This definition, however, only makes sense when $\in$ is a positive quantity. In general, however, it does not hold true when the frequency is close to the resonance. Therefore, this definition will not be used in the discussion herein. Instead, the focus will be on the susceptibility that has direct relationship with the microscopic atomic system. Wavevector k is a function of the frequency. Given $\chi(\omega)$, both $k(\omega)$ the inverse $\omega(k)$ can be obtained. While either $k(\omega)$ or $\omega(k)$ can be chosen, the latter will be used in this discussion to conform to most of the literature.

For pulses that have finite extent in the k space expansion, $\omega(k)$ can be Taylor expanded as follows:

$$\omega(k) = \omega(k_0) + \frac{d\omega}{dk}\bigg|_{k=k_0}(k-k_0) + \frac{1}{2!}\frac{d^2\omega}{dk^2}\bigg|_{k=k_0}(k-k_0)^2 + \ldots$$

$$k_0 = \sqrt{\varepsilon(\omega_0)}\,\frac{\omega}{c}$$

$$v_g \equiv \frac{d\omega}{dk}\bigg|_0 \equiv \frac{c}{n + \omega^{dn}/d\omega|_0}$$

where $n = \sqrt{\varepsilon_0(1+\chi(\omega))}$.

Again, the group velocity defined above is in general a complex quantity. The physical meaning of the group velocity should only be taken when it becomes a real number. When the imaginary part of the susceptibility is not zero and is large, it is more appropriate to describe the pulse propagation by an absorption coefficient (in units [1/cm]) defined by $$\alpha(\omega) = \frac{\omega \chi''(\omega)}{c\sqrt{1+\chi'(\omega)}}$$

where $\chi(\omega)=\chi'(\omega)+i\chi''(\omega)$.

In order to achieve large reduction of the group velocity without being absorbed at the same time, two very close spaced upper levels are needed. This configuration will yield a large positive derivative of the susceptibility with respect to the frequency. On the other hand, since the second derivative is nearly zero, there is minimum dispersion and, therefore, minimum distortion to the shape of the pulse when it propagates through the system.

The distortion of the pulse due to dispersion can be characterized by the dispersion parameter D defined as $$D = -\frac{2\pi}{\lambda^2}\left(2\frac{dn}{d\omega} + \omega\frac{d^2n}{d\omega^2}\right)_{\omega=\omega_0}$$

where D (in units [ps/km-nm]). Again, D has physical meaning only when n becomes real.

Figure 3:
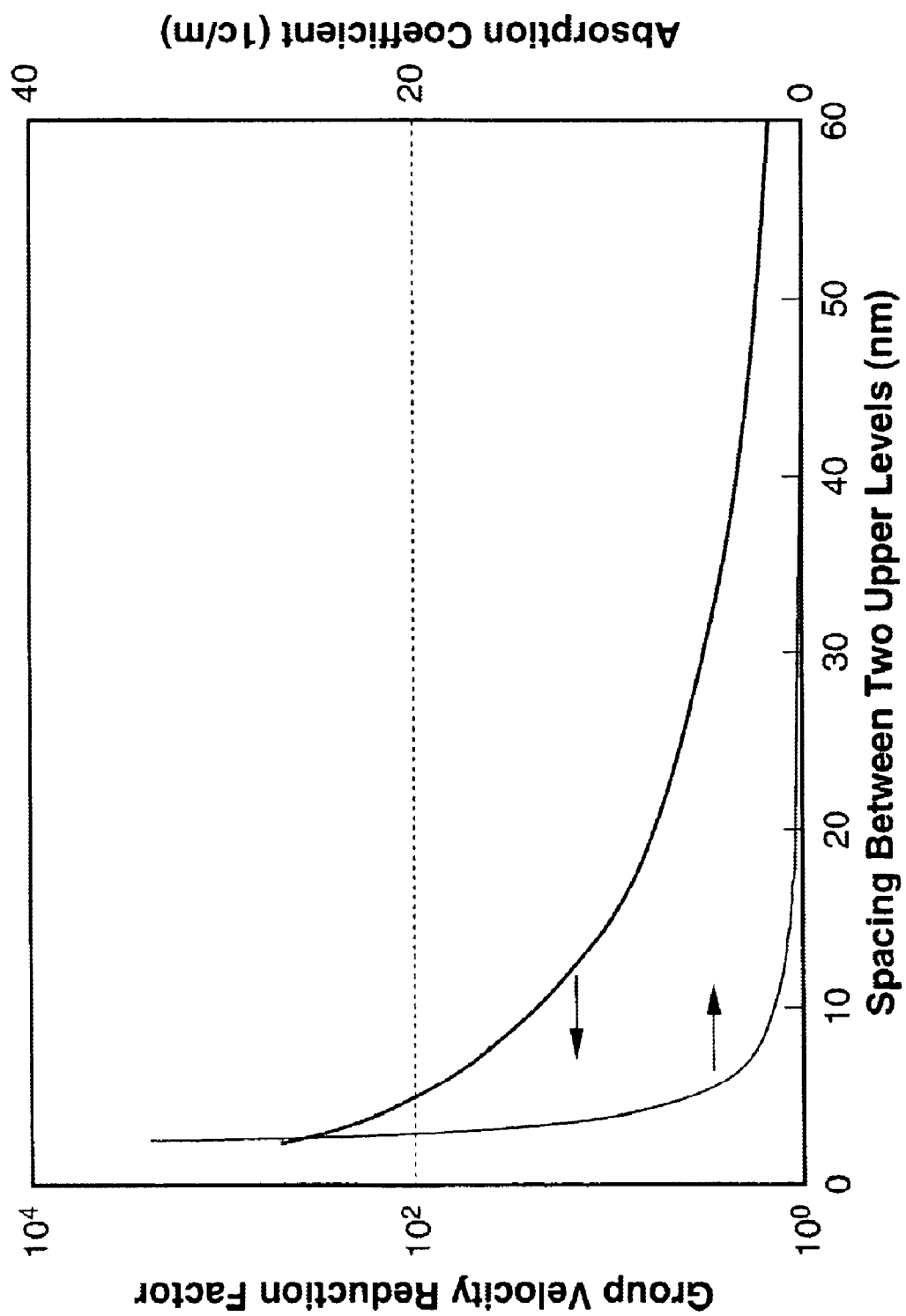
FIG. 3 is a graph showing the relationship between group velocity reduction factor, absorption coefficient and energy spacing between two upper levels in a simulated three-level system with a vacuum background.
Figure 4:
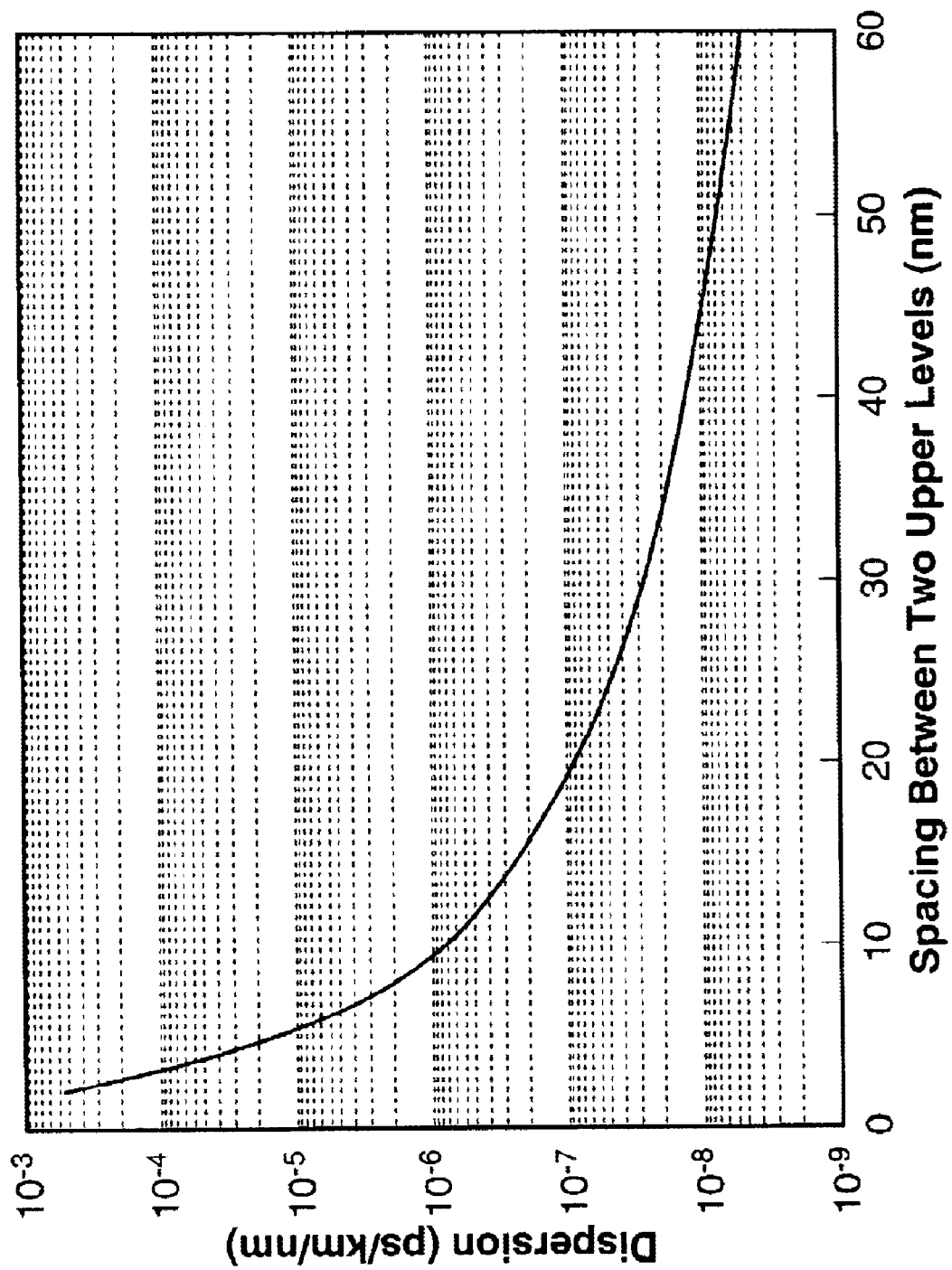
FIG. 4 is a graph showing the relationship between dispersion and energy spacing between two upper levels for the simulated three-level system associated with FIG. 3.

Using the above results, the group velocity reduction factor can be calculated, as can the absorption coefficient and the dispersion parameter. In the following simulations, the following parameters are assumed and we work on wavelength instead of frequency domain:

$\mu_1 = \mu_2 \approx er = 1.6 \times 10^{-19} \times 3 \times 10^{-8}$ (cm) atom size Electric field amplitude $$E_0 \approx \sqrt{\frac{2I}{\varepsilon_0}}$$

where I is the optical intensity=1 mW
$\omega_0$=1.55 $\mu$m
pulse width>0.25 ps
Using the following identities, $$\omega = \frac{2\pi c}{\lambda} \text{ (where } \lambda \text{ is the wavelength in the vacuum)}$$

$$\frac{d}{d\omega} = -\frac{\lambda^2}{2\pi c}\frac{d}{d\lambda}$$

$$\frac{d^2}{d\omega^2} = \frac{\lambda^3}{(2\pi c)^2}\left[2\frac{d}{d\lambda} + \lambda\frac{d^2}{d\lambda^2}\right]$$

the group velocity reduction factor, the absorption coefficient and the dispersion parameter can be rewritten in the wavelength domain as $$v_g = \frac{c}{n+\omega\frac{dn}{d\omega}} = \frac{c}{n-\lambda\frac{dn}{d\lambda}}$$

$$\alpha(\lambda) = \frac{2\pi}{\lambda}\frac{\chi''(\lambda)}{\sqrt{1+\chi'(\lambda)}}$$

$$D = -\frac{\lambda}{c}\frac{d^2n}{d\lambda^2}\bigg|_0$$

for $\lambda$ in [nm], c=3×10$^5$ [km/s], and D [ps/km/nm]. In a first simulation, dephasing time and upperstate lifetime are assumed to be 1 ns and 1 $\mu$s, respectively. For example, referring to FIG. 3 and FIG. 4, if the group velocity reduction factor is 100, for a device with length 0.126 cm, the output power level will drop to half of the input level and the total delay time duration achieved is 0.42 ns which corresponds to 4-bits in a 10 Gb/s optical link. As another example, if the group velocity reduction factor is 50, for same power penalty as above, a total delay of 1.16 ns (11.6 bits for 10 Gb/s optical link) for 0.69 cm device can be achieved.

In a second simulation, silica fiber was considered as a background. At room temperature, the refractive index at 1.55 pm for a silica fiber is nearly a constant for the wavelength span of interest. Therefore, the contribution from this background refractive index that takes the value 1.444 at 1.55 $\mu$m can simply be added.

Figure 5:
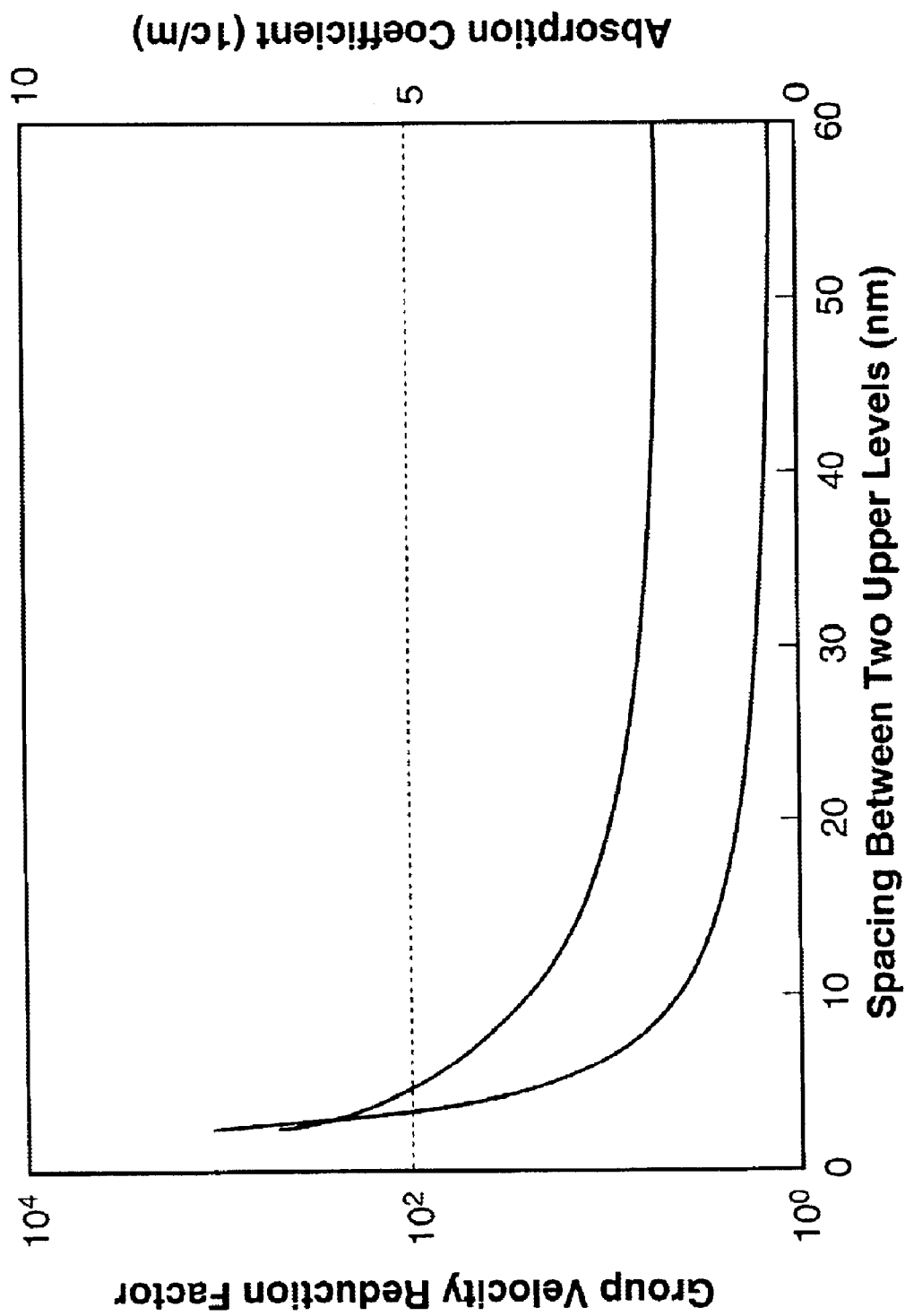
FIG. 5 is a graph showing the relationship between the group velocity reduction factor and absorption coefficient in a simulated three-level system with a GaAs background.

Referring to FIG. 5, in a third simulation consider GaAs with some impurities introduced to achieve this three level system. The ground has to be a sharp level as well and, therefore, the conduction band cannot be used as the ground state. Instead, it is necessary to use the excitonic peak or some impurities that have definite energy level in order to preserve the feature of three-level system and therefore have two sharply defined absorption peaks. The ground state in the following simulation is assumed to be very close to the conduction band so that the experimental value of the GaAs refractive index can still be used as a good approximation.

Figure 6:
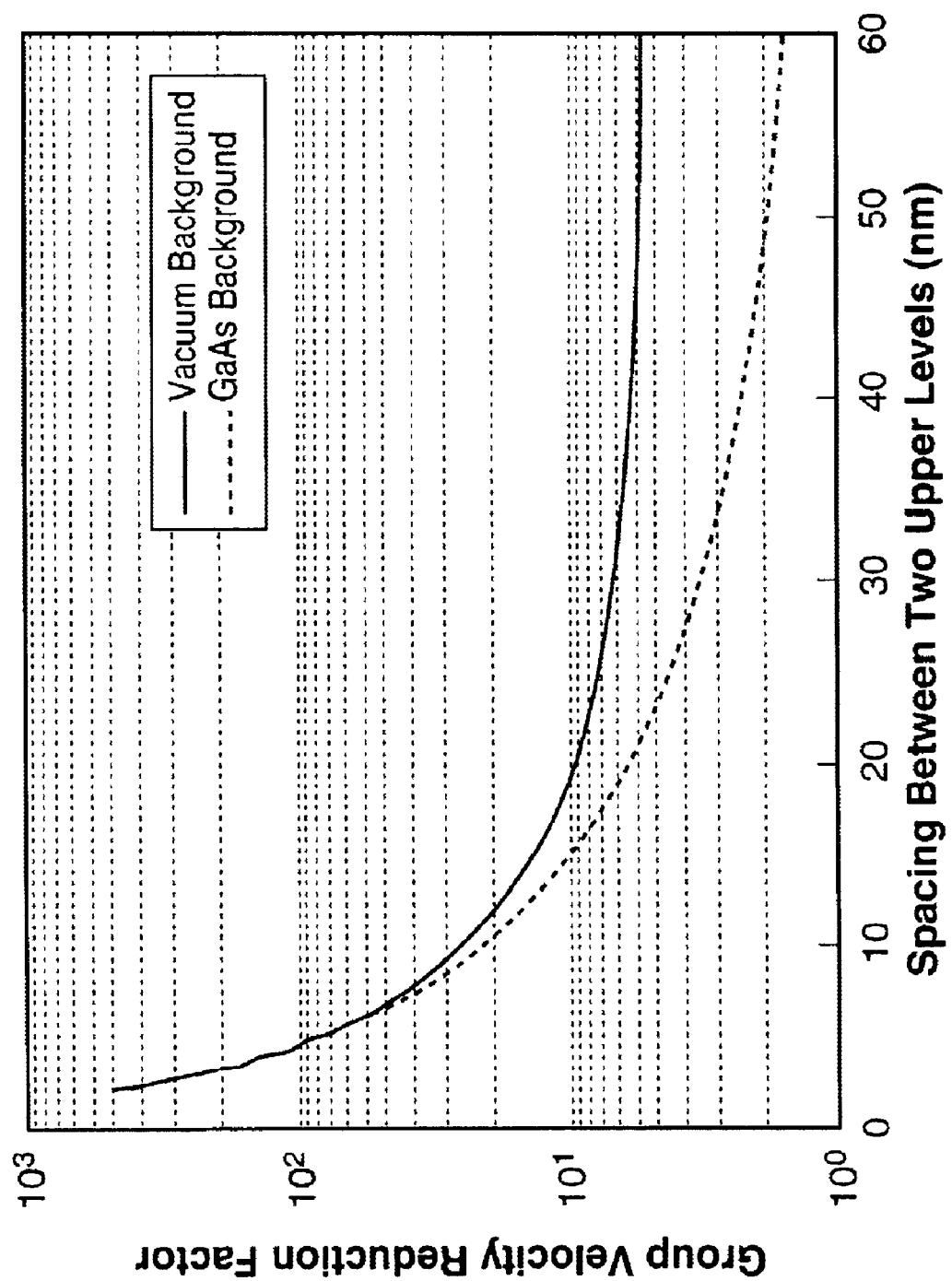
FIG. 6 is a graph showing the relationship between group velocity reduction factor and energy spacing between two uppers levels in a simulated three-level system, and comparing that relationship for a vacuum background and a GaAs background.
Figure 7:
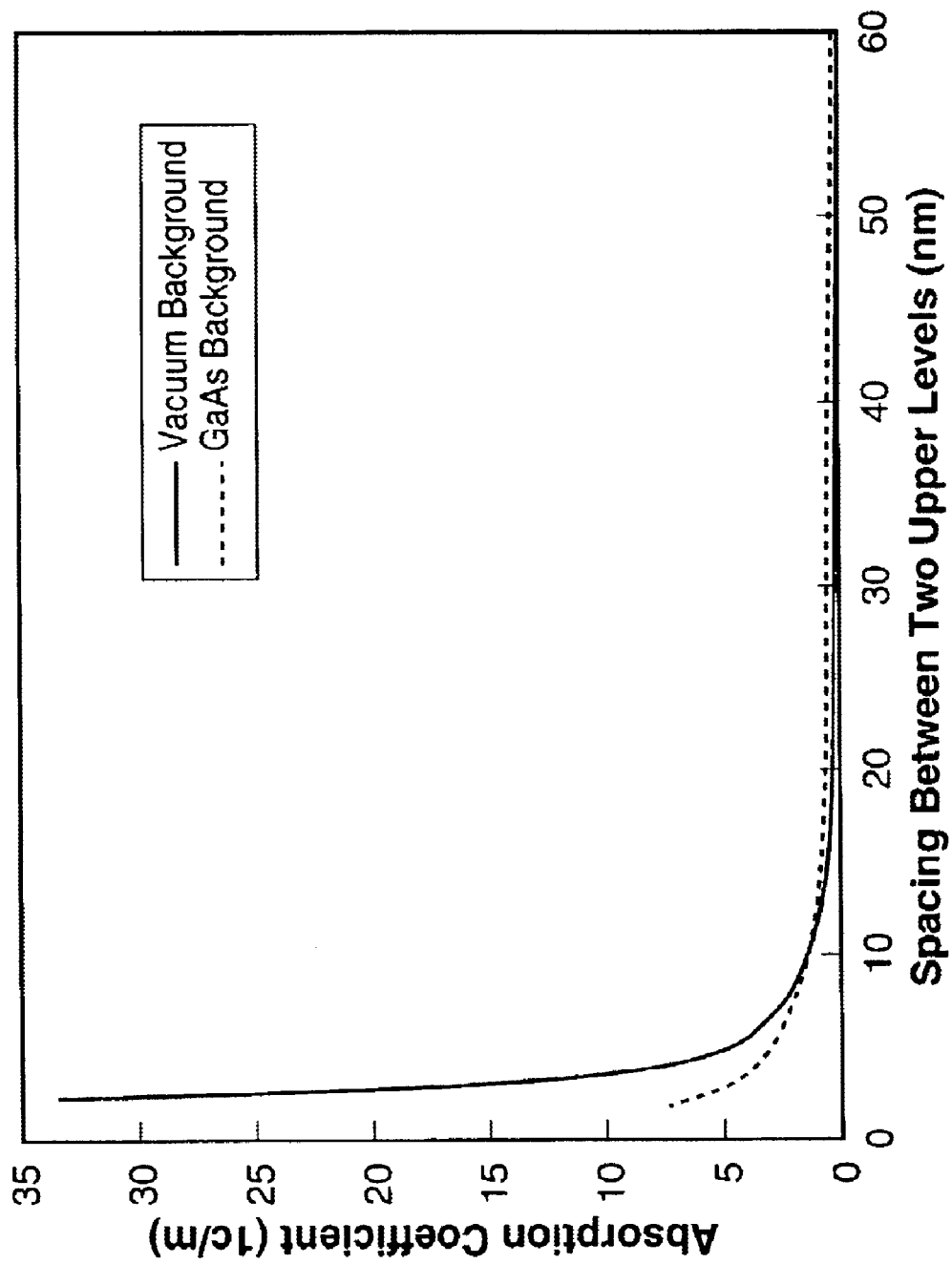
FIG. 7 is a graph showing the relationship between absorption coefficient and energy spacing between two uppers levels in a simulated three-level system, and comparing that relationship for a vacuum background and a GaAs background.

Referring to FIG. 6 and FIG. 7, as a comparison, if the group velocity reduction factor is 100, for a device with length 0.267 cm, the output power level will drop to half of the input level and the total delay time duration achieved is 0.89 ns which corresponds to 9 bits in a 10 Gb/s optical link. However, if the group velocity reduction factor is 50, for same power penalty as above, a total delay of 0.58 ns (6 bits for 10 Gb/s optical link) for a 0.347 cm device can be achieved. Note that the latter example gives the worst result compared to the vacuum background. This is because the absorption saturates at a higher level when spacing between two upper levels is large enough. The dispersion is exactly the same as in the vacuum background case.

From the above theoretical analysis, as well as numerical simulation, it was found that the reduction factor of the group velocity for the optical signal is a function of the spacing between two upper levels (referred to as $\Delta$ in the following discussion) in the three-level atomic system shown in FIG. 2. If $\Delta$ is tuned, then the reduction factor can be controlled Several mechanisms can be used to change the spacing between two upper levels. In the case where those two states are generated by strong coupling between two quantum dots in semiconductors, $\Delta$ can be controlled by adjusting the coupling strength between these quantum dots. Examples of ways that this can be done are: applying voltage, changing the temperature, applying pressure, applying acoustic wave through the devices, and so forth. All of these methods are feasible as can be seen from the following discussion.

First, consider two strongly coupled quantum dots with coupling in the y direction by placing two quantum dots closely together. The separation between them is denoted as d and the cubic quantum dot with size of L are assumed in the following analysis. To solve the energy levels of this strongly coupled system, the Schroedinger equation is solved. The energy of either of the two upper levels can be divided into three components as follows:

$$E_1 = E_x + E_z + E_{y1}$$

$$E_2 = E_x + E_z + E_{y2}$$

where the two levels have the energies for their x and z component. $E_{y2} - E_{y1} = \Delta$ is the energy separation between two upper levels. The wavefunctions for these two upper levels have opposite polarities. By applying an electric field across the y direction, the energy level will be shifted by an amount that can be calculated from time-independent perturbation theory as follows:

$$E_{y1}(new) = E_{y1}(v=0) - \frac{|H'_{12}|^2}{E_{y2}(V=0) - E_{y1}(V=0)}$$

$$E_{y2}(new) = E_{y1}(v=0) + \frac{|H'_{12}|^2}{E_{y2}(V=0) - E_{y1}(V=0)}$$

where opposite polarity of two wavefunctions have been used and interaction energy H is defined by $$|H'_{12}|^2 = |<2|eV|1>|^2$$

where V is applied voltage and e is electric charge. It can be seen that the amount of tuning is proportional to the square of applied voltage.

By changing the temperature, the physical size between two quantum dots can be changed by thermal expansion. Because there different thermal expansion coefficients for the quantum dots and the region in between the dots, L and d can be controlled by tuning the temperature. Since $\Delta$ is a function of overlap between wavefunctions in two quantum dots in the y direction, $\Delta$ can be changed by changing d and, therefore, the overlap between the wavefunctions. By changing L, a change to $E_1$ and $E_2$ will result; this can provide speed to tune the device to match the signal wavelength. By applying pressure, acoustic wave, the physical size of L and d can also be changed, therefore resulting in tuning of $\Delta$ as in the case of temperature tuning described above. Furthermore, by adopting the implementation of doped fiber as the device structure, $\Delta$ can be tuned by applying pressure to the fiber or sending an acoustic wave across the fiber. In the case of atomic gas, tuning can be achieved by changing temperature or changing the pressure inside the cell which contains the atomic gas.

Figure 8:
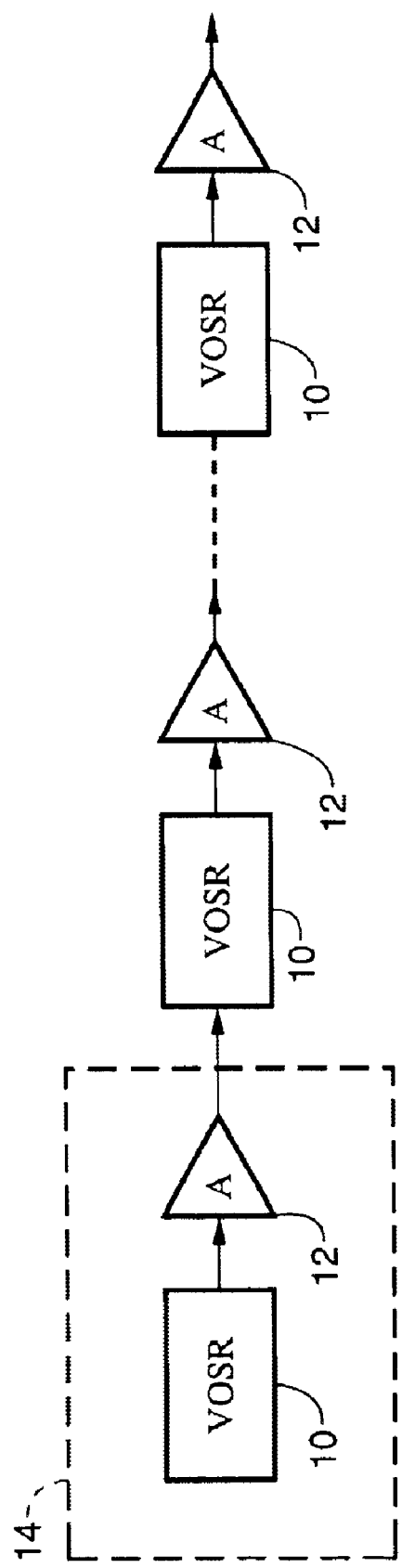
FIG. 8 is a block diagram of a variable all-optical shift register according to the present invention, and showing cascading of multiple shift registers to increase the capacity of the register size.

In the implementation of a variable all-optical shift register or buffer, it is desirable to control the amount of delay between zero and infinity. The absorption observed in the above simulation, however, limits the amount of delay for each single device before the signal drops experiences 3 dB drop. This problem can be solved by combining the group-velocity-reduction device with an optical amplifier, such as an erbium-doped fiber amplifier, Raman amplifier, or semiconductor optical amplifier. This is illustrated in FIG. 8. Each VOSR (Variable all-Optical Shift Register) 10 is a three level atomic system with tuning control. Each VOSR 10 is combined with an optical amplifier 12, denoted as A, to compensate the loss due to absorption in the VOSR. The unit 14, comprising a VOSR and optical amplifier, can be then cascaded to increase the capacity of register size. The scaling is linear; if each unit can accommodate N bits of optical signal, then the total register size is NM if M units are cascaded.

2. Semiconductor Quantum Dot Materials.

Semiconductor quantum dots are semiconductor nanostructures with three-dimensional potential confinement for both electrons and holes. The potential confinement results in quantization of the energy levels for both electrons and holes. The quantization then results discrete energy levels with sharp linewidths. Quantum dots have sizes typically comparable to the de Broglie wavelengths for both electrons and holes. The potential confinement can be, but not necessarily, provided by another semiconductor material which possess larger bandgap between conduction and valence bands. There have been several fabrication methods demonstrated to form semiconductor quantum dots. They include lithographic technique, interface fluctuations and self-organized growth (see, Bimberg et al., *Quantum Dot Heterostructures*, Chapters 2, 4 and 6, John Wiley & Sons, 1999). Materials suitable for quantum dots include SiGe; most of the III-V binary, ternary, and quaternary compounds; most of the II-VI binary, ternary, and quaternary compounds; and some I-VII compounds. III-V materials include arsenide-based compounds, phosphide-based compounds, antimonide-based compounds and nitride-based compounds. II-VI materials include sulfide-based compounds, selenide-based compounds, and telluride-based compounds.

Optical buffer devices according to the present invention as based on the use of semiconductor materials that exhibit direct bandgaps. Examples of specific materials that have been determined to have direct bandgap and which are suitable for use in the present invention include, but are not limited to:

(a) SiGe on Si substrates (see, K. Brunner et al., in *Proceedings 24th International Conference on the Physics of Semiconductors*, Jerusalem, Israel, 1998).

(b) (III-V binary arsenide-based) GaAs—InAs on InP substrates (See, J. Mori et al., "1.3–1.5 µm wavelength quantum dots self-formed in GaAs/InAs superlattices grown on InP(411) substrates," 2001 International Conference on Indium Phosphide and Related Materials, WP-63).

(c) (III-V binary arsenide-based) GaAs—$Al_xGa_{1-x}As$ on GaAs substrates, 0<=x<=1 (see, J. R. Guest, "Measurement of optical absorption by a single quantum dot exciton," *Phys. Rev. B*, vol. 65, 241310R, 2002).

(d) (III-V binary arsenide-based) InAs—GaAs on Si substrates (see, A. F. Tsatsul'nikov et al., in *Proceedings 24th International Conference on the Physics of Semiconductors*, Jerusalem, Israel, 1998).

(e) (III-V ternary arsenide-based) $In_xGa_{1-x}As$—$Al_yGa_{1-y}As$ on GaAs substrates, 0<=x<=1; 0<=y<=1 (the first material is the quantum dot material and second material is the matrix which provides the potential barrier for three-dimensional confinement; see D. Bimberg et al., *Quantum Dot Heterostructures*, Chapters 2, 4 and 6, John Wiley & Sons, 1999).

(f) (III-V ternary arsenide-based) $In_xGa_{1-x}As$—InGaP on GaAs substrates (see, S. Kim et al., "Growth and characterization of InGaAs—InGaP quantum dots for midinfrared photoconductive detector," *Appl. Phys. Lett.*, vol. 73, pp. 963–965, August 1998).

(g) (III-V quaternary arsenide-based) GaInNAs—GaAs on GaAs substrates (see, M. Sopanen et al., "Self-assembled GaInNAs quantum dots for 1.3 and 1.55 µm emission on GaAs," *Appl. Phys. Lett.*, vol. 76, pp. 994–996, February 2000).

(h) (III-V binary nitride-based) GaN—AlN on Si substrates (see, B. Damilano et al., "From visible to white light emission by GaN quantum dots on Si(111) substrate,"*Appl. Phys. Lett.*, vol. 75, pp. 962–964, August 1999).

(i) (III-V binary nitride-based) InGaN—AlGaN (see, H. S. Hirayama, in *Proceedings of 2nd International Conference on Nitride Semiconductors*, Tokushima, Japan, p. 472. 1997).

(j) (III-V binary phosphide-based) InP—InGaP on GaAs substrates (see, J. Porsche et al., "Growth of self-assembled InP quantum islands for red-light-emitting injection lasers," IEEE JSTQE, vol. 6, pp. 482–490, 2000).

(k) (III-V binary antimonide-based) GaSb—GaAs on GaAs substrates (see, P. M. Thibado et al., "Evolution of GaSb epitaxy on GaAs(001)-c(4×4),"*J. Vac. Sci. Technol. A*, vol. 14, pp. 885–889, May 1996).

(l) (II-VI binary selenide based) CdSe—GaAs (see, H. C. Ko et al., "Self-organized CdSe quantum dots onto cleaved GaAs (110) originating from Stranski-Krastanow growth mode," *Appl. Phys. Lett.*, vol. 70, pp. 3278–3280, June 1997).

(m) (II-VI ternary selenide-based) $Zn_xCd_{1-x}Se$—ZnSe, 0<=x<=1 (see, M. Lowisch et al., "Zero-dimensional excitons in (Zn,Cd)Se quantum structures," *Phys. Rev. B*, vol. 54, R11074, 1996).

(n) (I-VII) CuCl-glass (see, T. Kataoka et al., "Mesoscopic enhancement of optical nonlinearity in CuCl quantum dots Giant-oscillator-strength effect on confined excitons," *Phys. Rev. B*, vol. 48, pp. 2815–2818, July 1993).

3. General Design Criteria for Strained QWs and QDs in Photonic Bandgap Materials To overcome the unsuitability for use in optical applications exhibited by conventional quantum dots (QD) and QD devices, a variable semiconductor optical buffer according to the present invention is preferably fabricated using a material having sharp, discrete and highly coherent energy levels, similar to that of an atom. By fabricating a 3D Bragg reflector surrounding a quantum well or quantum dot active region, we effectively create a photonic bandgap to sharpen the strained quantum well (QW) or quantum dot (QD) energy levels. The following are major design criteria for such a device.

(a) Electronic States

Compressive strained QWs, tensile QWs, coupled strained QWs with compressive and/or tensile strain, and strained InAs compressive quantum dot structures are examples of structures suitable for a variable semiconductor optical buffer according to the invention. In a coupled quantum well structure, the two lowest levels using the two hole states are preferably chosen; for example, the light-hole and heavy-hole subbands from coupled tensile-compressive strained quantum wells. The goal is to engineer the interband and intersubband optical transition dipole moment for optimized effects in electromagnetically induced transparency (EIT). Although quantum well structures suffer from a homogeneous broadening linewidth of the order of 5 meV, they have the unique property that the transition energies and dipole selection rules can be engineered with considerable freedom and precision. On the other hand, while quantum dots have the desirable discrete density of states, the inhomogeneity of QD size tends to broaden the spectra. To sharpen the density of states in both quantum wells and quantum dots, spectral linewidth can be reduced by means of the photonic bandgap.

(b) Photonic Bandgap Effects

By placing the photonic bandgap crystals above quantum wells or quantum-dot layers, the spectral density of the structure can be determined for both two-dimensional and three-dimensional photonic crystals. Polarization dependence also plays an important role, since the control field and the signal field, and their coupling interband and intersubband optical transition dipole moments, via the dressed electronic states, all affect the operation of the electromagnetically induced transparency. A waveguide structure can then be easily designed using the photonic crystal for the guidance of the signal beam, and the control field can be applied using a vertical coupling geometry or a waveguide geometry. The coherent coupling region for the control field and the signal field are additional aspects of the design.

(c) Electromagnetically Induced Transparency

A density-matrix approach can be used to calculate the absorption spectrum and the refractive index spectrum of the signal wavelength in the presence of the optical pump (control field). The control field affects the electronic property to form the dressed states and serves as a variable for the optical buffer to slow down the signal beam. Accordingly, a design model can be easily developed for the optical properties of the strained quantum wells and quantum dots in photonic crystals with an optical pump field present.

It will be appreciated by those skilled in the art that QD lasers have been developed that exhibit threshold current and current density comparable to or lower than those of QW lasers. In most cases, the QDs are fabricated using highly compressively-strained InAs material on a GaAs substrate. Strained quantum-well lasers have been shown to demonstrate higher performance over their lattice-matched counterparts in terms of reduced threshold current density, high temperature operation, and high-speed modulation. While there is still significant nonuniformity in that approach, the continuing improvements indicate that approach to be very promising. Some of the most important parameters affecting the performance of high-speed semiconductor lasers include the optical gain spectrum, the refractive index change with injected current, and the linewidth enhancement factor. Accordingly, the amplified spontaneous emission, gain, and refractive index spectra of strained InGaAsP and InAlGaAs quantum-well lasers designed for applications in long-wavelength 1.55 μm communication systems were modeled in the development of the present invention. For example, the spontaneous emission intensity was modeled as an equivalent electric current source of radiation and was calculated directly from Maxwell's equations in the presence of gain. It was found that amplified spontaneous emission spectroscopy provides a very sensitive diagnostic tool to investigate a strained semiconductor quantum well in the presence of carrier injection by a forward voltage bias.

4. Fabrication of Buried AlAs (AlOx) Channels/ODs in Buried AlOx Photonic Crystals An aspect of the present invention is to fabricate highly strained QDs from either compressive-strained or tensile-strained materials. It will be appreciated that strain can be achieved by varying growth conditions and/or using organometallic materials.

Figure 9:
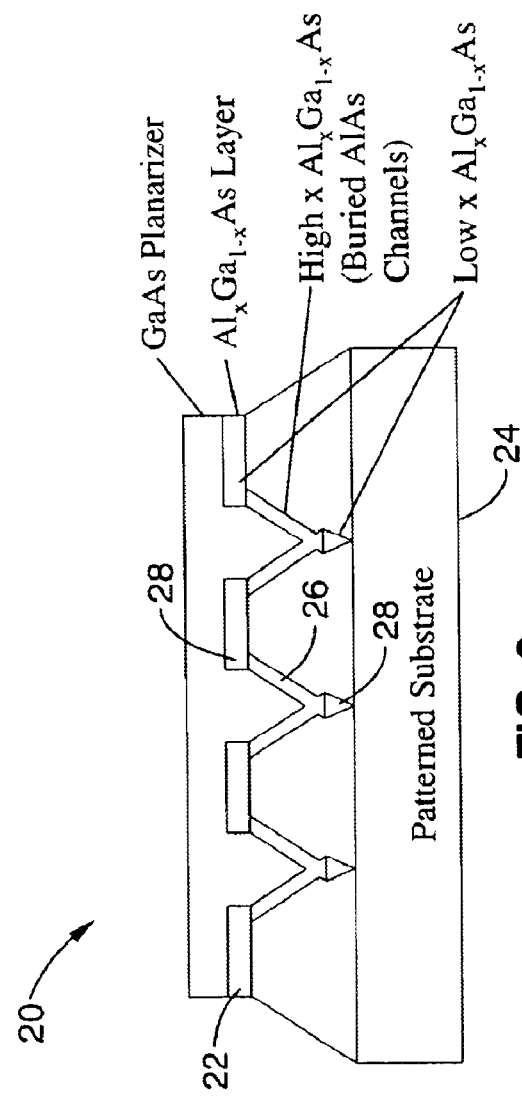
FIG. 9 is a schematic diagram showing MOCVD growth of a single AlAs channel layer on a patterned substrate in accordance with the present invention.

The effect of 3D photonic bandgap engineering on such QD materials can be evaluated using an inventive buried AlOx channel structure based on the following criteria:

(a) First, it is possible to grow a layer of AlGaAs with varied Al composition along the plane of growth by metalorganic chemical vapor deposition (MOCVD) on a patterned substrate. This is illustrated by FIG. 9 which shows a schematic of a structure 20 resulting from MOCVD growth of one AlAs channel layer 22 on a patterned substrate 24. This effect takes place because Ga has a longer diffusion length than Al. Thus, while growing a nominal $Al_xGa_{1-x}As$ layer, one can obtain lateral variation of x by an appreciable amount. The period of the grooves on the patterned substrate can be on the order of sub-microns, depending of the growth temperature and the metal-organic compounds used. In FIG. 9, the high x $Al_xGa_{1-x}As$ (buried AlAs channels) regions 26 and the low x $Al_xGa_{1-x}As$ regions 28 are also illustrated.

(b) Second, the wet thermal oxidation rate of $Al_xGa_{1-x}As$ has an exceedingly strong dependence on the Al concentration x. Hence, by growing a nominal AlGaAs layer with, for example, x=0.9, one can create regions with x>0.9 and x<0.9. A higher x will be found on the layer on the (111) surfaces than on the (100) surfaces. The high Al content region can be subsequently oxidize and become AlOx. Since the wet thermal oxidation rate has a threshold like exponential dependence on Al content, AlOx channels can be created. Multiple layers of such channels can be created in one single growth or multiple growths.

Figure 10:
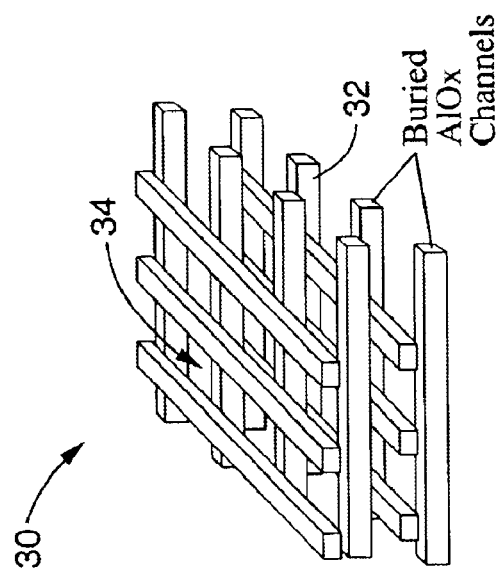
FIG. 10 is a schematic diagram of a three-dimensional (3D) photonic bandgap crystal made of periodic repeated buried AlOx channels in accordance with the present invention.

For example, buried AlAs channels can be fabricated using MOCVD growth on a patterned substrate with periodic grooves having a period shorter than the Ga diffusion distance (about 1–5 μm). Using e-beam lithography, grooves can be fabricated with 0.24 μm or less period for a first order grating at 1.55 μm wavelength. Due to the higher mobility of Ga, it tends to migrate and grow faster on (100) surfaces. Hence, for a nominal growth of $Al_xGa_{1-x}As$, such as x>0.9, a significant Al composition variation can be created by the patterned substrate, leaving a higher Al composition on (111) surfaces and a lower one on (100) surfaces. This structure can be planarized easily with subsequent growth of GaAs or high Ga content AlGaAs. The process can be repeated to create a multiple layers of high Al composition channels. FIG. 10 shows a schematic diagram of a 3D photonic bandgap crystal 30 made of periodic repeated buried AlOx channels 32 created by multiple growths on a patterned substrate with patterns along two perpendicular directions. The spaces 34 between the channels are filled with GaAs, which is not shown in this figure for better clarity.

Another approach to creating the buried AlAs is to use MBE growth with a shadow-masked substrate. Using an in-situ movable mask with stripes of windows, stripes of AlGaAs growth can be created. By moving the mask in and out of the molecular beams, alternative layers of growth of AlGaAs strips and planar GaAs can be formed. With this method, the substrate never needs to leave the high vacuum growth chamber and the quality can be high. The size of the windows may be limited however.

Figure 11:
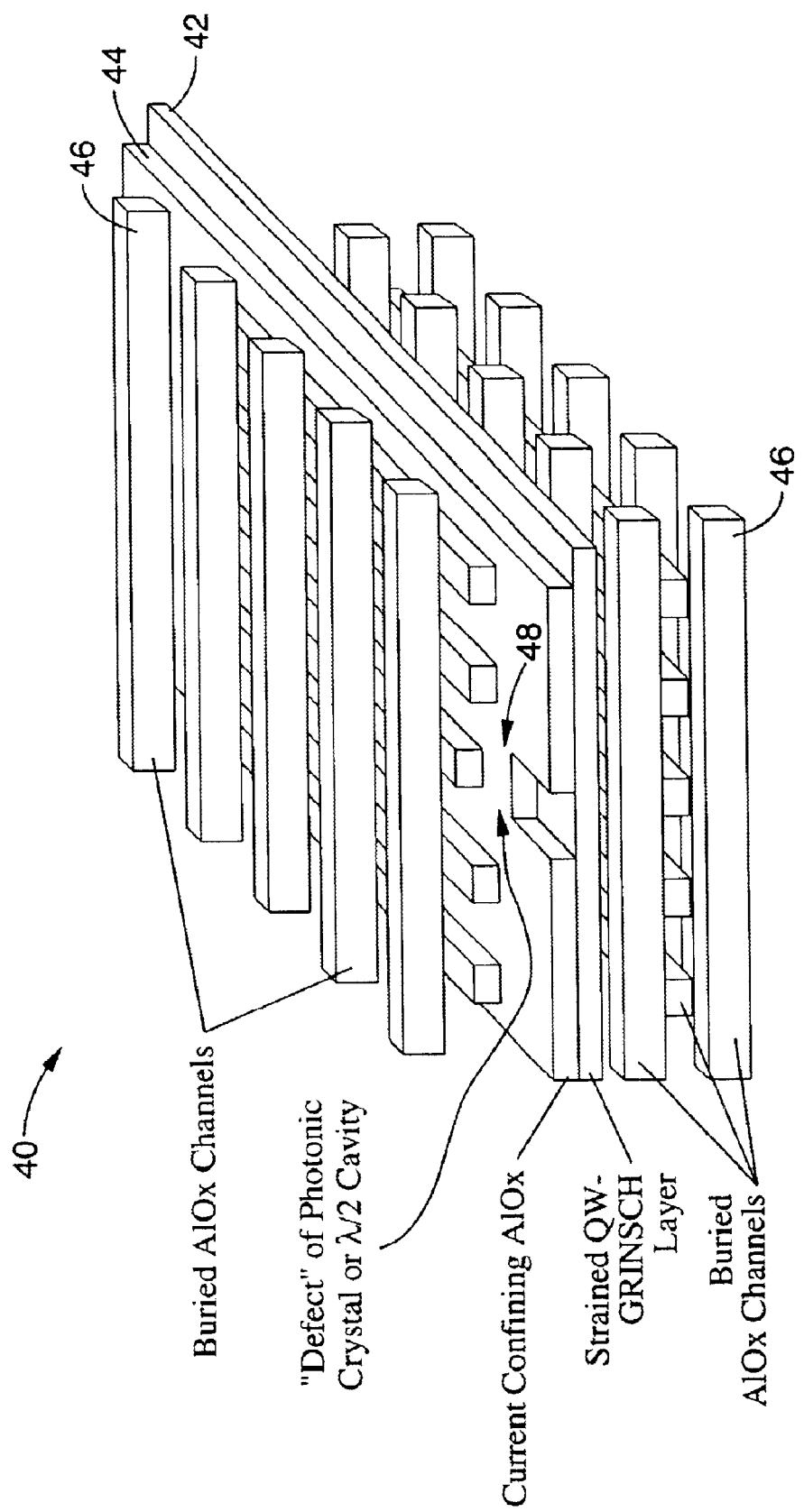
FIG. 11 is a schematic diagram of a three-dimensional (3D) Bragg cell in accordance with the present invention where a quantum well region is sandwiched by 3D AlOx channels and where a "defect" or half-wave center creates an optical cavity for coherent interference.

Referring now to FIG. 11, an example of a 3D Bragg cell 40 fabricated in accordance with the present invention and having a very high level of quantum confinement in the active region (cavity) is schematically shown. In this structure, a quantum well region depicted by strained QW-GRINSCH layer 42 is grown adjacent to a current confining AlOx layer 44 and sandwiched between 3D AlOx channels 46. This requires the growth of QDs or QWs, preferably highly strained, to be sandwiched between the patterned substrate AlGaAs growth. A "defect" or half-wave center 48 creates an optical cavity for coherent interference. Due to the photonic bandgap effect, the quantum wells or quantum dots in the active region can be made to exhibit a higher level of quantum confinement.

It will be appreciated that an important aspect of the fabrication of a Bragg cell is the patterned substrate growth formation and the selective oxidation process (discrimination against Al content). TEM and E-DEX in SEM can be used to identify the oxidation selectivity, and oxidation conditions such as chamber pressure and substrate temperature can be controlled to increase selectivity of the oxidation to result in highly confined AlOx. The other fabrication steps of a Bragg cell laser involve standard metallization, thermal annealing, etc.

Note also that the buried aluminum oxide thus described is highly generic for fabrication of ultrahigh speed and low noise lasers and detectors, optical circuits and integrated optics, and is useful for fabricating 3D stackable optical devices.

5. ASE Spectroscopy Measurements of Group Index Spectrum

The group index, and therefore the group velocity, of an optical buffer according to the present invention can be measured, for example, using either of the following two methods: (1) amplified spontaneous emission spectroscopy (ASE) when an active semiconductor quantum-well or quantum-dot amplifier or laser is fabricated; and (2) optical transmission spectroscopy (OTS) to extract the group index for a passive optical buffer structure.

ASE measurements can be taken using an optical spectrum analyzer. The Fabry-Perot peaks exhibit a blue shift in the presence of a larger injection current. The gain spectrum of the laser can be measured based on the Hakki-Paoli method for current biases below threshold. The modal gain is obtained from the peaks and valleys of the longitudinal Fabry-Perot modes. The peak wavelength of each mode in the amplified spontaneous emission spectrum is a function of the refractive index. The effective (and group) index can also be extracted for each longitudinal mode in the amplified spontaneous emission spectrum.

For a passive optical buffer, the optical transmission spectrum can be measured to extract the group index. This can be accomplished using a spectrometer and a tunable source (erbium-doped fiber amplifier) and couple the light with a wavelength covering a broad range into the optical buffer and measure the transmission spectra with and without the external pump light. This measurement allows for the investigation of reduction in the group velocity of the optical signal near 1.55 µm wavelength.

Note that the gain and the refractive index profiles of a strained quantum-well laser structure can be extracted accurately by taking into account the optical confinement factor. Furthermore, accurate monitoring of the differential gain and the Fabry-Perot peak shift with injection current allows measurement of the linewidth enhancement factor, which has a direct impact on the high-speed modulation of semiconductor lasers. Agreement between our theoretical results and experimental data verifies the material parameters and the quantum-well band structures used in our model and demonstrates that ASE spectroscopy provides an excellent tool for diagnosing a strained quantum-well structure under current injection.

6. Design and Fabrication of a Variable Optical Buffer

Controlled "slow down" of light according to the invention can be achieved by pumped light or applying a bias voltage across the quantum well structure which embeds the quantum dots. For example, "slow down" of an optical signal at 1.55 µm can be controlled using a laser pump. It can also be controlled by a bias voltage across a coupled quantum-well structure in which the light-hole and heavy-hole subband energy splitting in separate tensile-compressive wells can be adjusted by the electric field due to the voltage bias.

Since the length of an optical packet is an architecture and standard issue and, at present, very uncertain, consider a 125-Byte packet as an example for ease of computation. A buffer in a packet router needs to have a minimum capacity to store one entire packet, which is 1 kbits. Assuming 100 Gbps is the bandwidth per channel, 1 kbits of storage is equivalent to 10 nanosecond, and for a device that is 500 micron long, a slow down factor of 1000 is needed with a turn-on time resolution of 10 picosecond (one bit).

In order to optimize the storage capacity, turn-on response time, and minimize the dispersion, it may be difficult to simultaneously optimize the optical signal loss and required pump laser intensity. However, on the same semiconductor substrate, it is possible to integrate a semiconductor optical amplifier to compensate for the optical losses. Further, a pump field of a power density 2 MW/cm$^2$ has been successful in quantum wells using a ladder 1-2-3 configuration. This magnitude of power density is equivalent to the optical power density in an index guided semiconductor laser of 2 mW per 1 µm×0.1 µm cross section area. Thus, such an optical pump laser can be integrated on the same substrate to minimize optical loss and maintain high pump beam intensity. The ability to integrate semiconductor devices such as the pump laser and optical amplifier is a major advantage of a variable semiconductor optical buffer according to the present invention.

An ideal buffer should have a storage length that is adjustable by an external control. Furthermore, the turn-on (store) and turn-off (release) time should be shorter than a fraction of a bit period. An all-optical buffer in accordance with the present invention addresses these required functionalities and is based on a device design with a group velocity that can be controllably slowed down, which effectively constitutes an adjustable memory.

Figure 12:
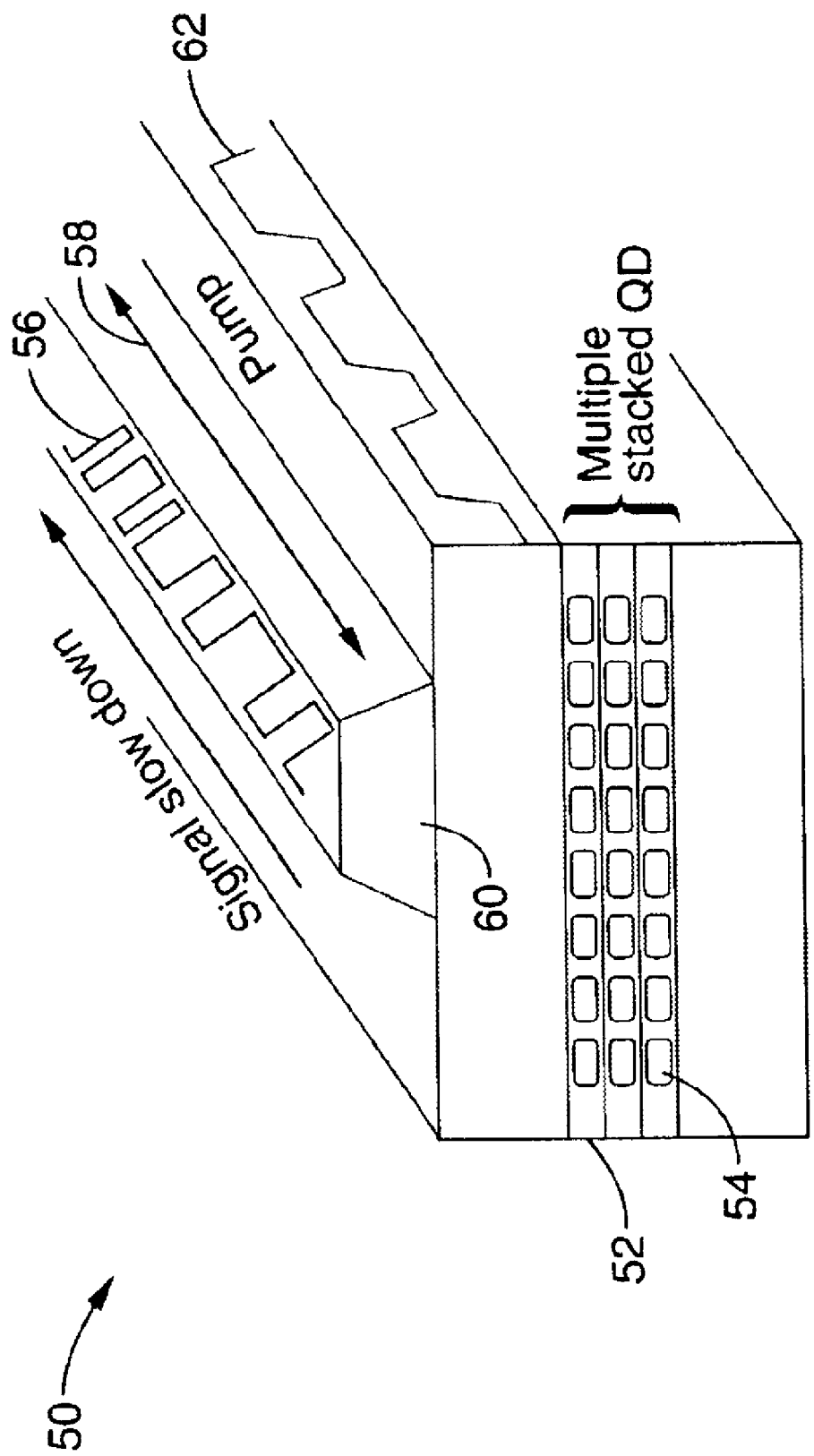
FIG. 12 is a schematic diagram of a variable semiconductor all-optical buffer in accordance with the present invention.

Accordingly, the present invention comprises a buffer using EIT in a semiconductor quantum dot (QD) structure. A schematic of an embodiment of an optical buffer 50 with a plurality of layers 52 of QDs 54 to slow down the light according to the present invention is shown in FIG. 12. Note that the signal 56 and the pump light 58 co-propagate or counter-propagate in the same waveguide 60. The pump light induces EIT and slows down the signal light velocity. The QDs act like giant "atoms" in which the potential confinement in three dimensions creates quantized electron and hole levels, and the number of confined energy states can be controlled by choosing the materials and geometries of the QDs. In the embodiment shown, the multiple-stacked QDs create slow light by means of EIT induced by the pump laser (not shown) and the pump power controls the slow-down factor. The grating 62 creates slow-light via photonic bandgap engineering and the slow-down factor is controlled by applying a voltage or current in the vertical direction. The signal velocity reduction factor is the product of the contributions of the grating and QDs.

For a three-level system in which $|1>\leftrightarrows|2>$ and $|2>\leftrightarrows|3>$ transitions are dipole-allowed, the time-dependent optical dielectric constant $\in$ for the signal light can be derived from the density-matrix formulation. For simplicity, assume the signal (S) is weak compared to the pump (P) light such that the Rabi frequencies $\Omega_s<<\Omega_p$, where $\Omega_i=\mu_i E_i/2\hbar$ (i=S or P) and $E_i$ are the complex electric field amplitudes. Also, the signal and pump light frequencies are chosen to coincide with $|1>\leftrightarrows|2>$ and $|2>\leftrightarrows|3>$ transitions, respectively, but allow the signal to have small detuning $\delta=\omega_{21}-\omega_S$ from the energy separation $\hbar\omega_{21}$ between $|1>$ and $|2>$. In this case, the system has optimum performance and we can write the dimensionless dielectric constant at the steady state for the signal light as $$\varepsilon = \varepsilon_{bac} + \frac{U_{21}}{\hbar(\delta - i\gamma_{21}) - \hbar\Omega_{PP}^2/(\delta - i\gamma_{31})}$$

where $U_{21}=(\Gamma/V)|\mu_{21}|^2(f_1-f_2)/\in_0$ and $\Omega_{PP}^2=|\mu_{32}|^2 I_P/4\hbar^2 c\in_0 \sqrt{\in_{bac}}$; $\in_{bac}$ is the background dielectric constant without coupling to any light; $\in_0=8.85\times10^{-12}$ (F/m); $\Gamma$ is the optical confinement factor; V is the volume of the QD; $I_P$ is the pump power density (MW/cm$^2$), c is the speed of the light in the vacuum; $\gamma_{21}$ is the coherent coupling damping rate (linewidth) between QD and the signal field; $\gamma_{31}$ accounts for the dephasing between $|3>$ and $|1>$; $f_1$ and $f_2$ are Fermi-Dirac occupation factors. The signal velocity is given by the group velocity if there is no distortion from group velocity dispersion. The signal velocity slow-down factor S, the absorption coefficient $\alpha$, and the group velocity dispersion D are determined from the first and the second derivatives of $\in$ with respect to the frequency. In the following discussions, we assume the signal detuning $\delta$ is zero. In this case, $\alpha$ is given by $$\alpha = \frac{\sqrt{2}\,\omega_S U_{21}}{\sqrt{\varepsilon_{bac} + \sqrt{\varepsilon_{bac}^2 + \varepsilon_{res}^2}}\,\hbar c(\gamma_{21} + \Omega_{PP}^2/\gamma_{31})}$$

and S is given by $$S = \left[\frac{\varepsilon_{bac} + \sqrt{\varepsilon_{bac}^2 + \varepsilon_{res}^2}}{2}\right]^{1/2} \left[1 + \frac{\hbar\omega_S}{2\sqrt{\varepsilon_{bac}^2 + \varepsilon_{res}^2}} \frac{U_{21}(\Omega_{PP}^2 - \gamma_{31}^2)}{\hbar^2(\gamma_{31}\gamma_{21} + \Omega_{PP}^2)^2}\right]$$

where $\in_{res}(\Omega_{PP}^2)=U_{21}/\hbar(\gamma_{21}+\Omega_{PP}^2/\gamma_{31})$. The buffer has a storage time $\tau=LS\sqrt{\in_{bac}}/c$ for a device of length L, and a turn-on threshold at pump power density $\Omega_{PP,(min)}^2=\gamma_{31}^2$. For a small $\in_{res}$, S has a maximum when $\Omega_{PP,(max)}^2=\gamma_{31}(\gamma_{21}+2\gamma_{31})$. For high pump power density and small $\gamma_{31}$, S approaches the upper bound of system performance given by $$S_{max}=\omega_S/(4\sqrt{2}\gamma_{31}).$$

Conversely, for low pump power density and large $\gamma_{31}$, EIT ceases and the QD resumes a Lorentzian absorption spectrum. For a large $\gamma_{21}$ or $\gamma_{31}$, $\alpha \propto U_{21} \propto \xi^2$ and for a small $\gamma_{21}$ or or $\gamma_{31}$, $\alpha \propto \sqrt{U_{21}} \propto \xi$.

The absorption coefficient can be reduced by choosing different pump power. We define a figure-of-merit F as the measure of total buffering time before the signal has to be re-amplified. For small product of $\alpha L$ which is the case for practical applications, F is given by $$F = \frac{S}{c\alpha}.$$

F has a minimum at finite pump power density and scales as $F \Box I_P$ when $I_P$ is large. Therefore the buffer performance can be optimized by choosing the best combination of slow-down factor and the absorption.

EXAMPLE

Figure 13:
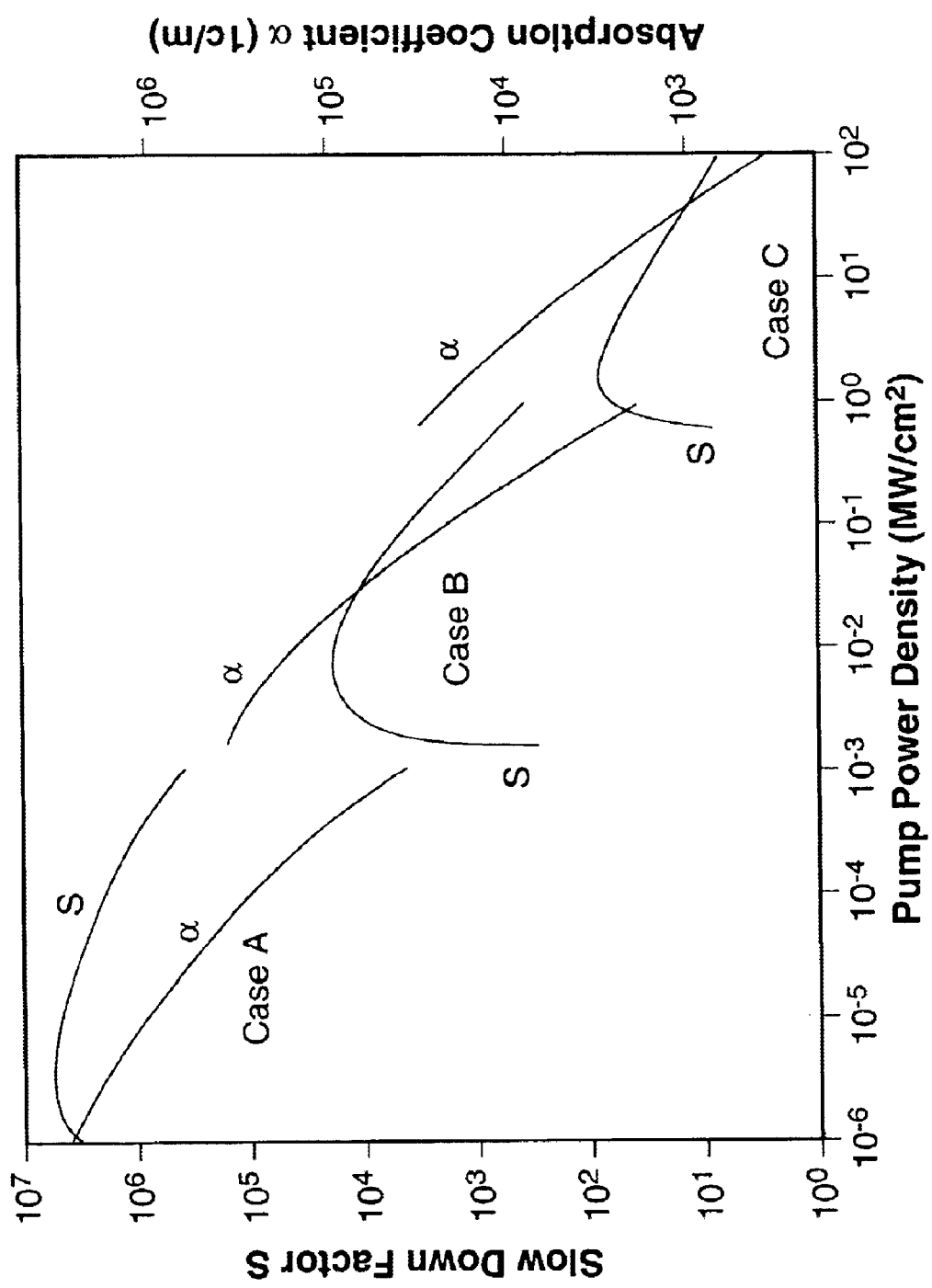
FIG. 13 is a graph showing slow-down factor and absorption coefficient as a function of pump power density at three different linewidth regimes for the optical buffer shown in FIG. 12.
Figure 14:
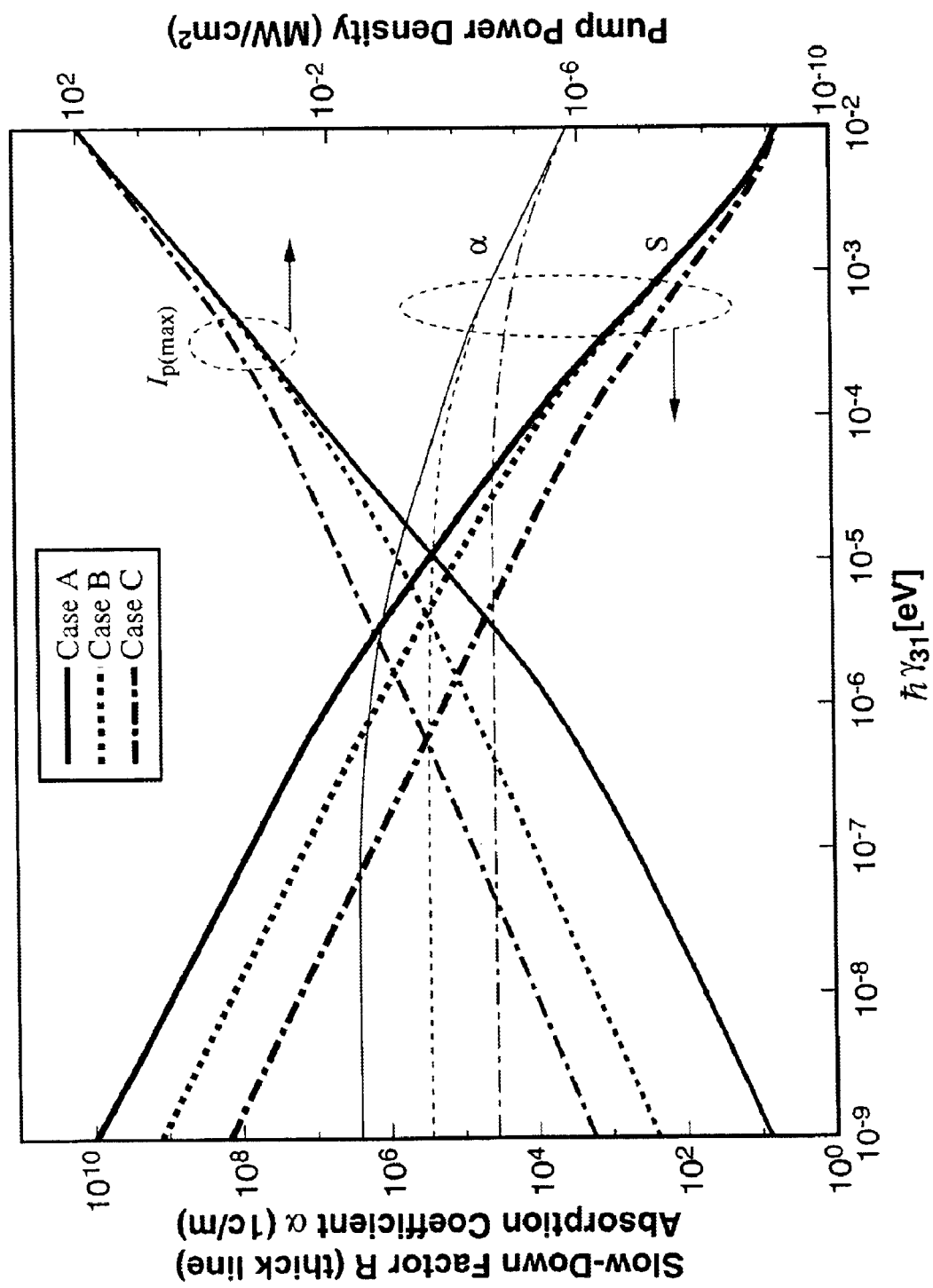
FIG. 14 is a graph showing the influence of $\hbar\gamma_{31}$ on slow-down factor, absorption coefficient and required pump power density at three different linewidth regimes for the optical buffer shown in FIG. 12.

In this example, disk-shaped QDs are used. $|1>$ is chosen to be the hole level in the valence band; $|2>$ and $|3>$ are chosen to be the electronic levels in the conduction band. In our calculations, $\omega_S=1.55$ $\mu$m, $\delta=0$, $|\mu_{32}|/e=25$ Å, $|\mu_{21}|/e=15\xi$Å where e and $\xi$ are electron charge and excitonic enhancement factor due to the confinement of electrons and holes inside the QD, respectively. Ten vertically-stacked QD layers with 8 nm diameter, 10 nm height, and surface density of $4\times10^{10}$/cm$^2$ are used. FIG. 13 shows the slow-down factor S and the loss $\alpha$ experienced by the signal light under different pump power intensity. The group velocity slow-down factor (left axis) and the corresponding absorption coefficient (right axis) are plotted as a function of the pump power density. Three different linewidth regimes are compared. Case A, B, C corresponds to 1 $\mu$eV, 50 $\mu$eV and 1 meV, respectively. Enhancement factor $\xi=10$ is used in this plot. $\hbar\gamma_{31}=\hbar\gamma_{21}$ takes the values of 1 $\mu$eV, 50 $\mu$eV and 1 meV in cases A, B, and C, respectively. The slow-down factors reach maximum values of $5.8\times10^6$, $1.9\times10^4$ and 82 at pump levels of $3\times10^{-6}$, $7\times10^{-3}$ and 1.9 MW/cm$^2$ with corresponding group velocity dispersions of $-1.5\times10^4$, $-1.22$ and $-0.61$ ps/km-nm, for cases A, B, and C, respectively. The dispersion for case A can be reduced to zero by choosing pump power density $1.6\times10^{-4}$ MW/cm$^2$ with a corresponding slow-down factor of $1.5\times10^6$. FIG. 14 shows the influence of $\gamma_{31}$ on the slow-down factor, absorption coefficient and pump power density. All are improved with the decrease of $\gamma_{31}$.

Experimentally a single QD has been shown to have $\mu$eV dephasing at low temperatures. This would correspond to a slow-down factor of more than $10^6$, requiring ~10 W/cm$^2$ pump power density. At room temperature, the dephasing time $\hbar\gamma_{31}$ is 2.2 meV, and is attributed to phonon scattering. But a slow-down factor of 82 can still be achieved and can be improved by increasing the enhancement factor $\xi$. For linewidths greater than 10 meV, the required pump laser intensity may create catastrophic facet damage for semiconductor materials. The buffer turn-on and turn-off times depend on pump Rabi frequency $\Omega_P$ and are of the order of a few ps (or less) for large (or small) linewidths with the above material parameters based on our transient model. The light pulses can slow down significantly with a negligible dispersion, making it desirable for making optical buffers with an adjustable storage. Narrow linewidth QD fabrication is found to be important to the overall device performance.

Figure 15:
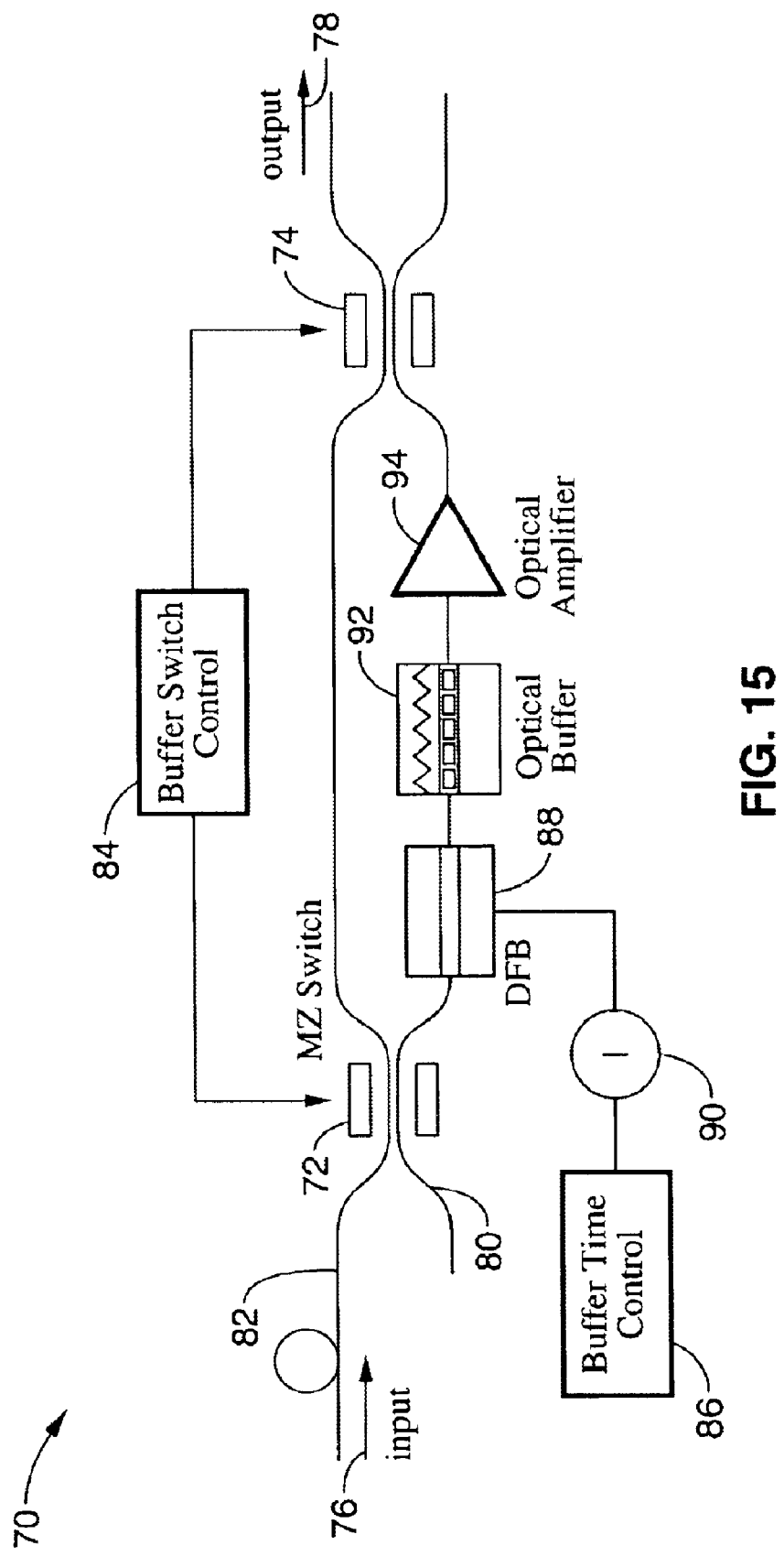
FIG. 15 is a system block diagram of an implementation of a variable semiconductor all-optical buffer in accordance with the present invention.

Referring now to FIG. 15, a functional block diagram of an embodiment 70 of a system employing an optical buffer according to the invention described herein is shown. In the embodiment shown in FIG. 15, a two-branch configuration is used and a pair of Mach-Zehnder (MZ) switches 72, 74 are placed in the input and output paths 76, 78, respectively. The signal to be buffered is routed through the lower branch 80 by MZ switch 72 and the signal not to be buffered passes through the upper branch 82. Operation of MZ switches 72, 74 is controlled by a buffer switch control element 84 as shown. A buffer time control element 86 controls the power of a distributed feedback (DFB) laser 88 (e.g., pump laser as described in FIG. 12) by varying the injection current 90. DFB laser 88 is coupled to optical buffer 92 which is in turn coupled to an optical amplifier 94. The optical amplifier ahead of the output compensates for the losses induced by the optical buffer. Note the correlation between the combination of optical buffer 92 and optical amplifier 94 and the configuration of VSOR 10 and amplifier 12 in FIG. 8.

Figure 16:
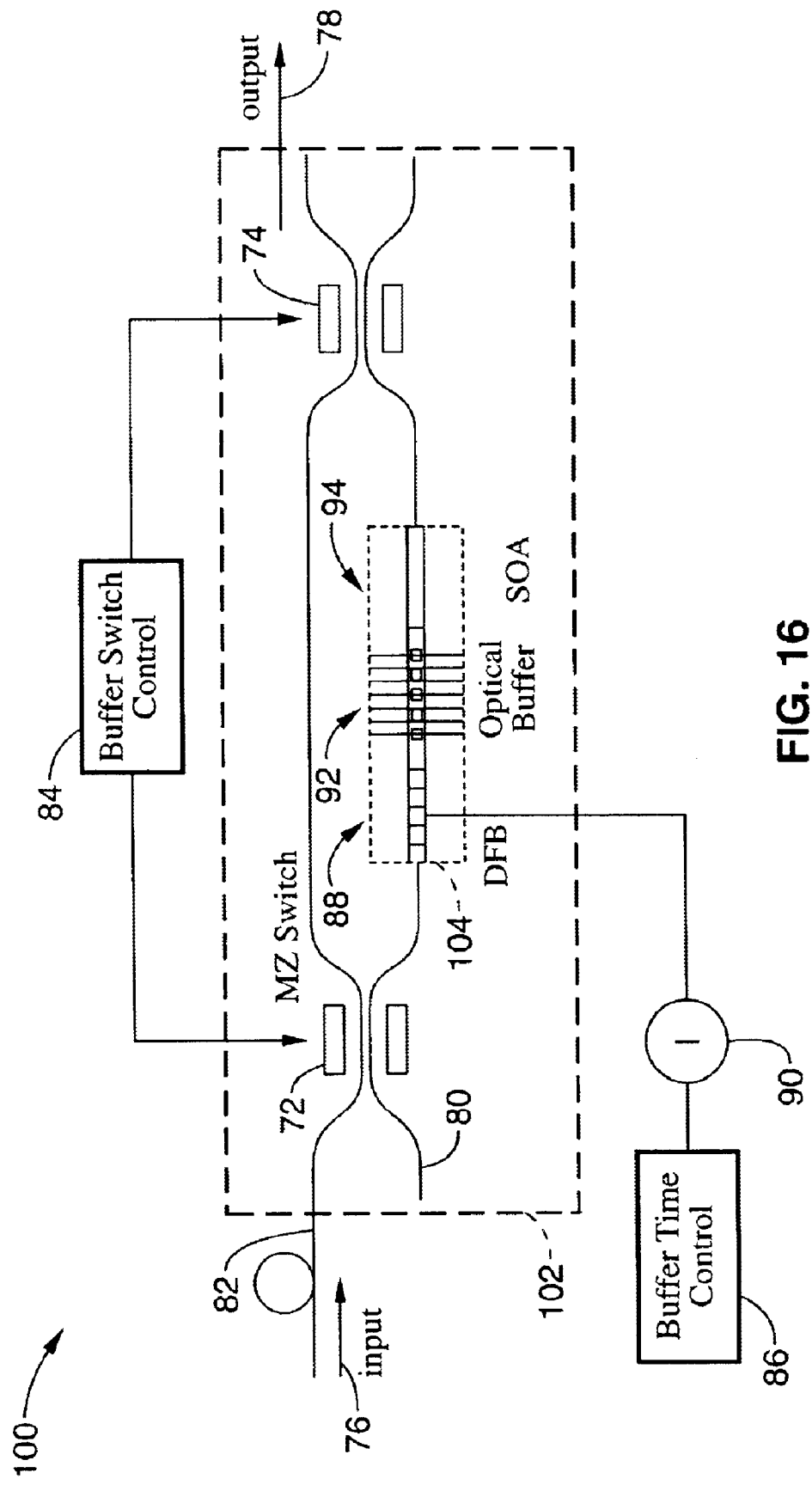
FIG. 16 is a schematic top view of an integrated monolithic implementation of the system shown in FIG. 15.

The system illustrated in FIG. 15 can be implemented using discrete components or, using the fabrication techniques of the present invention previously described as a monolithic integration of components 100 as shown in FIG. 16. Two levels of monolithic integration are shown in FIG. 16. In one embodiment, the MZ switches, DFB, optical buffer, and optical amplifier can be integrated as shown by element 102 in FIG. 16. In another embodiment, the DFB, optical buffer and optical amplifier can be integrated and be separate from the MZ switches as shown by element 104 in FIG. 16.

Accordingly, it can be seen that the present invention uses EIT as a tool to slow and/or slow light. A variable semiconductor all-optical buffer according to the invention uses strained quantum dot structures where the buffering effect is achieved by slowing down the optical signal with control light source to vary the dispersion characteristic of the medium. The control light source can be external or monolithically integrated with the buffer(s) and amplifier(s) used in an overall system. Furthermore, instead of pumping the control light source, the control signal can be carried by an electric field to allow faster and more precise control. As described herein, several aspects of the invention include using EIT to make an optical buffer, a digital optical buffer that is semiconductor based, a method of fabricating a 3D Bragg cell and the 3D Bragg cell fabricated thereby, strained self-assembled quantum dots, slow light control using an electric field, variable semiconductor all-optical buffers, shift registers and other optical devices based on slow light, and monolithic integration of an all-optical device with a control laser and/or amplifier.

Although the description above contains many specificities, these should not be construed as limiting the scope of the invention but as merely providing illustrations of some of the presently preferred embodiments of this invention. Thus the scope of this invention should be determined by the appended claims and their legal equivalents. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. An optical buffering device, comprising:
   a semiconductor material having at least one single quantum structure configured for buffering and slowing an optical signal using electromagnetically induced transparency.

2. An optical buffering device as recited in claim 1:
   wherein said semiconductor material is configured to receive optical energy for controlling the slowing of said optical signal.

3. An optical buffering device as recited in claim 1:
   wherein said single quantum structure comprises a single quantum dot structure.

4. An optical buffering device as recited in claim 3:
   wherein said single quantum dot structure comprises a plurality of stacked single quantum dots.

5. An optical buffering device as recited in claim 4:
   wherein said quantum dots slow said propagation speed by electromagnetic induced transparency.

6. An optical buffering device as recited in claim 5, further comprising:
   a pump laser configured to induce electromagnetically induced transparency in said quantum dot structure.

7. An optical buffering device as recited in claim 6:
   wherein slowing of said optical signal is controllable by pump power of said laser.

8. An optical buffering device as recited in claim 1:
   wherein said quantum structure is further configured with a grating for slowing said optical signal according to photonic bandgap engineering.

9. An optical buffering device as recited in claim 8:
   wherein said grating comprises a Bragg grating.

10. An optical buffering device as recited in claim 8:
    wherein slowing of said optical signal is controllable by applying a voltage or current to said grating.

11. An optical buffering device as recited in claim 8:
    wherein said grating comprises a plurality of burled AlOx channels.

12. An optical buffering device as recited in claim 4, wherein said quantum dots comprise strained self-assembled quantum dots.

13. An optical buffering device as recited in claim 4, wherein said electromagnetically induced transparency is controllable by an electric field across said quantum dots.

14. An optical buffering device as recited in claim 6:
    wherein said electromagnetically induced transparency is controllable by an electric field across said quantum dots; and
    wherein said electric field carries a control signal for said laser.

15. An optical buffering device as recited in claim 6:
    wherein said quantum dot structure and said laser are monolithically integrated.

16. An optical buffering device as recited in claim 1:
    wherein said semiconductor material has a length;
    wherein said optical buffering device has a memory size; and
    wherein said memory size is a function of said length and slowing of said optical signal.

17. An optical buffering device as recited in claim 1, further comprising:
    an optical waveguide configured to guide said optical signal.

18. A semiconductor-based optical buffer, comprising:
    a semiconductor material having at least one strained single quantum structure configured to slow propagation of an optical signal and buffer the optical signal using electromagnetically induced transparency.

19. An optical buffer as recited in claim 18:
    wherein slowing of said optical signal occurs at room temperature.

20. An optical buffer as recited in claim 18:
    wherein said semiconductor material comprises a plurality of photonic crystals which sharpen spectral linewidths due to its density of states.

21. An optical buffer as recited in claim 18;
    wherein said semiconductor material is configured to receive optical energy for controlling the slowing of said optical signal.

22. An optical buffer as recited in claim 18, further. comprising:
    a pump laser configured to induce electromagnetically induced transparency in said semiconductor material.

23. An optical buffer as recited in claim 22:
    wherein slowing of said optical signal is controllable in response to the level of pump power of said laser.

24. An optical buffer as recited in claim 18:
    wherein said semiconductor material has a length;
    wherein said optical buffer has a memory size; and
    wherein said memory size is a function of said length and slowing of said optical signal.

25. An optical buffer as recited in claim 18:
    wherein said electromagnetically induced transparency is controllable in response to the application of an electric field across said quantum structure.

26. An optical buffer as recited in claim 21:
    wherein said electromagnetically induced transparency is controllable in response to the application of an electric field across said quantum structure; and
    wherein said electric field carries a control signal for said laser.

27. An optical buffer as recited in claim 18, further comprising:
    an optical waveguide configured to guide said optical signal.

28. A semiconductor-based optical buffer, comprising:

a semiconductor material having at least one strained quantum structure in conjunction with a photonic bandgap engineered material, said semiconductor configured to slow propagation of an optical signal and to buffer the optical signal using electromagnetically induced transparency.

29. An optical buffer as recited in claim 28:

wherein slowing of said optical signal occurs at room temperature.

30. An optical buffer as recited in claim 28:

wherein slowing of said optical signal is a function of inhomogeneity of quantum dot size.

31. An optical buffer as recited in claim 28:

wherein said semiconductor material is configured to receive optical energy for controlling the slowing of said optical signal.

32. An optical buffer as recited in claim 28:

further comprising a pump laser configured to induce electromagnetically induced transparency in said semiconductor material.

33. An optical buffer as recited in claim 32:

wherein slowing of said optical signal is controllable in response to the level of pump power of said laser.

34. An optical buffer as recited in claim 28:

wherein said semiconductor material has a length:

wherein said optical buffer has a memory size; and wherein said memory size is a function of said length and slowing of said optical signal.

35. An optical buffer as recited in claim 28:

wherein said electromagnetically induced transparency is controllable by an electric field across said quantum structure.

36. An optical buffer as recited in claim 31:

wherein said electromagnetically induced transparency is controllable by an electric field across said quantum structure; and wherein said electric field carries a control signal for said laser.

37. An optical buffer as recited in claim 28, further comprising:

an optical waveguide configured to guide said optical signal.

38. An optical buffering device, comprising:

a semiconductor quantum structure configured for slowing an optical signal and buffering the optical signal using electromagnetically induced transparency;

a grating configured for slowing said optical signal by photonic bandgap engineering; and a laser configured to induce said electromagnetically induced transparency;

said laser controllable by an electric field that controls coupling of quantize states in said semiconductor quantum structure.

39. An optical buffering device as recited in claim 38:

wherein said semiconductor quantum structure comprises a material that exhibits direct bandgaps.

40. An optical buffering device as recited in claim, 38:

wherein interband and intersubband optical transition dipole moments in said semiconductor quantum structure are configured for using said electric field to control coupling strength.

41. An optical buffering device as recited in claim 38:

wherein said electric field carries a control signal for said laser.

42. An optical buffering device, comprising:

a semiconductor quantum structure configured with a plurality of strained quantum wells or strained quantum dots, or both, arranged in stacks for slowing an optical signal and buffering the optical signal within optical shift registers using electromagnetically induced transparency;

an optical amplifier coupled to said optical shift register;

wherein said optical shift register and said optical amplifiers are configured in a plurality of alternating stages within said semiconductor quantum structure to extend buffer depth beyond the attenuation limits of a single optical shift register stage;

a grating configured for slowing said optical signal by photonic bandgap engineering; and a laser configured to induce said electromagnetically induced transparency;

said laser controllable by an electric field that controls coupling of quantize states in said semiconductor quantum structure.

43. An optical buffering device as recited in claim 42:

wherein interband and intersubband optical transition dipole moments in said semiconductor quantum structure are configured for using said electric field to control coupling strength;

wherein said semiconductor quantum structure comprises a semiconductor material that exhibits direct bandgaps.

44. An optical buffering device as recited in claim 42:

wherein said electric field carries a control signal for said laser.

45. An optical buffering device, comprising:

a semiconductor quantum structure configured with a plurality of strained quantum wells or strained quantum dots, or both, arranged in stacks for slowing an optical signal and buffering the optical signal using electromagnetically induced transparency;

stages of alternating optical shift registers with optical amplifiers within said semiconductor quantum structure allowing the depth of said buffering to exceed the attenuation limited buffering of a single optical shift register;

a grating configured for slowing said optical signal by photonic bandgap engineering; and a laser configured to induce said electromagnetically induced transparency;

said laser controllable by an electric field that controls coupling of quantize states in said semiconductor quantum structure;

wherein interband and intersubband optical transition dipole moments in said semiconductor quantum structure are configured for using said electric field to control coupling strength;

wherein said electric field carries a control signal for said laser.

46. An optical buffering device as recited in claim 45:

wherein said semiconductor quantum structure comprises a material that exhibits direct bandgaps.

47. An optical buffering device, comprising:

a semiconductor quantum structure configured with a plurality of strained quantum wells or strained quantum dots, or both, arranged in stacks for slowing an optical signal and buffering the optical signal within the semiconductor using electromagnetically induced transparency;

a grating configured for slowing said optical signal by photonic bandgap engineering; and a laser configured to induce said electromagnetically induced transparency;

wherein said semiconductor quantum structure and said laser are monolithically integrated.

48. An optical buffering device, comprising:

a semiconductor quantum structure configured with a plurality of strained quantum wells or strained quantum dots, or both, arranged in stacks for slowing an optical signal and buffering the optical signal within the semiconductor using electromagnetically induced transparency;

a grating configured for slowing said optical signal by photonic bandgap engineering;

a laser configured to induce said electromagnetically induced transparency;

wherein said semiconductor quantum structure and said laser are monolithically integrated; and an optical amplifier monolithically integrated with said semiconductor quantum structure and said laser;

wherein a plurality of integrated stages having alternating semiconductor quantum structure optical buffers and said optical amplifiers are coupled to said laser, thereby forming an optical buffer of a desired length depending on the number of buffer-amplifier stages are incorporated.

49. An optical buffering device, comprising:

a semiconductor quantum structure configured with a plurality of strained quantum wells or strained quantum dots, or both, arranged in stacks forming an optical shift register of an optical buffer for slowing an optical signal using electromagnetically induced transparency;

optical amplifiers interspersed between a plurality of stages of said optical shift register to extend the capacity of said optical buffering device;

a grating configured for slowing said optical signal by photonic bandgap engineering;

a laser configured to induce said electromagnetically induced transparency;

wherein said semiconductor quantum structure, said laser, said optical shift register, and said optical amplifier are monolithically integrated.

50. An optical buffering device as recited in claim 1, wherein said quantum structure comprises a quantum well structure.

51. An optical buffering device as recited in claim 1, wherein said semiconductor material has a plurality of said single quantum well structures.

52. An optical buffering device as recited in claim 16, wherein said memory size is sufficient to retain at least one packet of optical data.

53. An optical buffer as recited in claim 18, wherein said strained quantum structure comprises at least one single quantum well structure.

54. An optical buffer as recited in claim 18, wherein said semiconductor material has a plurality of said strained single quantum well structures.

55. An optical buffer as recited in claim 18, wherein said strained quantum structure comprises at least one single quantum dot structure.

56. An optical buffer as recited in claim 55, wherein said single quantum dot structure comprises a plurality of stacked single quantum dots.

57. An optical buffer as recited in claim 18, further comprising a grating for slowing said optical signal according to photonic bandgap engineering.

58. An optical buffer as recited in claim 57, wherein said grating comprises a Bragg grating.

59. An optical buffer as recited in claim 24, wherein said memory size is sufficient to retain at least one packet of optical data.

60. An optical buffering device as recited in claim 38, wherein said buffering device has a memory size sufficient to retain at least one packet of optical data.

61. An optical buffering device as recited in claim 42, wherein said buffering device has a memory size sufficient to retain at least one packet of optical data.

62. An optical buffering device as recited in claim 45, wherein said buffering device has a memory size sufficient to retain at least one packet of optical data.

63. An optical buffering device as recited in claim 49, wherein said buffering device has a memory size sufficient to retain at least one packet of optical data.

64. A semiconductor-based optical buffer, comprising:

a semiconductor material having a plurality of quantum wells or quantum dots, or both, configured to slow propagation of an optical signal through the optical buffer using electromagnetically induced transparency;

said optical buffer having sufficient length to retain at least one optical packet.

65. An optical buffer as recited in claim 64, wherein said quantum wells or quantum dots comprise strained quantum wells or quantum dots, respectively.

66. An optical buffer as recited in claim 64, wherein said semiconductor material is configured to receive optical energy for controlling the slowing of said optical signal.

67. An optical buffer as recited in claim 64, wherein said electromagnetically induced transparency is controllable in response to the application of an electric field across said quantum structure.

68. An optical buffer as recited in claim 64, further comprising a grating configured for slowing said optical signal by photonic bandgap engineering.

69. An optical buffering device as recited in claim 68, wherein said grating comprises a Bragg grating.

70. An optical buffering device, comprising:

a semiconductor quantum structure configured with a plurality of strained quantum wells or strained quantum dots, or both, arranged in stacks forming an optical shift register of an optical buffer through which said optical signal is slowed using electromagnetically induced transparency;

optical amplifiers interspersed between a plurality of stages of said optical shift register to extend the capacity of said optical buffering device to at least one optical data packet; and a laser configured to induce said electromagnetically induced transparency.

71. An optical buffering device as recited in claim 70, wherein said semiconductor material is configured to receive optical energy for controlling the slowing of said optical signal.

72. An optical buffering device as recited in claim 70, wherein said electromagnetically induced transparency is controllable in response to the application of an electric field across said quantum structure.

73. An optical buffering device as recited in claim 70, wherein said semiconductor quantum structure, said laser, said optical shift register, and said optical amplifier are monolithically integrated.

74. An optical buffering device as recited in claim 70, further comprising a grating configured for slowing said optical signal by photonic bandgap engineering.

75. An optical buffering device as recited in claim 74, wherein said grating comprises a Bragg grating.

76. An optical buffering device, comprising:
a semiconductor quantum structure forming an optical shift register of an optical buffer within which the optical signal is slowed using electromagnetically induced transparency;
optical amplifiers interspersed between a plurality of stages of said optical shift register to extend buffer capacity to at least one optical data packet;
a grating configured for slowing said optical signal by photonic bandgap engineering; and
a laser configured to provide optical energy for controlling the slowing of said optical signal by said electromagnetically induced transparency;
wherein said semiconductor quantum structure, said laser, said optical shift register, and said optical amplifier are monolithically integrated.

77. An optical buffering device, comprising:
a semiconductor material configured for slowing an optical signal using electromagnetically induced transparency;
wherein said semiconductor material comprises a quantum dot structure;
wherein said quantum dot structure comprises a plurality of stacked quantum dots;
wherein said quantum dots slow said propagation speed by electromagnetic induced transparency;
a pump laser configured to induce electromagnetically induced transparency in said quantum dot structure;
wherein slowing of said optical signal is controllable by pump power of said laser;
wherein said quantum dot structure further comprises a grating.

* * * * *